United States Patent
Yang et al.

(10) Patent No.: US 10,950,175 B1
(45) Date of Patent: Mar. 16, 2021

(54) PIXEL ARRANGEMENT AND REFLECTOR STRUCTURE OF LED DISPLAY AND METHOD OF FORMING SAME

(71) Applicant: AU OPTRONICS CORPORATION, Hsin-Chu (TW)

(72) Inventors: Wen-Wei Yang, Hsin-Chu (TW); Pin-Miao Liu, Hsin-Chu (TW); Cheng-Chieh Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/392,034

(22) Filed: Apr. 23, 2019

(51) Int. Cl.
*G09G 3/3233* (2016.01)
*H01L 27/32* (2006.01)
*H01L 33/50* (2010.01)
*H01L 33/60* (2010.01)

(52) U.S. Cl.
CPC .......... *G09G 3/3233* (2013.01); *H01L 27/322* (2013.01); *H01L 27/3246* (2013.01); *H01L 33/50* (2013.01); *H01L 33/60* (2013.01)

(58) Field of Classification Search
CPC .......... G09G 3/3233; G09G 2300/0439; H01L 33/60; H01L 27/3246; H01L 27/3218; H01L 27/326; H01L 27/3211; F21Y 2115/10
See application file for complete search history.

(56) References Cited

U.S. PATENT DOCUMENTS

| 10,038,031 B2 | 7/2018 | Yang et al. | |
|---|---|---|---|
| 2012/0228659 A1* | 9/2012 | Hsu | H01L 33/642 257/98 |
| 2013/0222705 A1 | 8/2013 | Shimizu et al. | |

(Continued)

FOREIGN PATENT DOCUMENTS

| CN | 104037199 A | 9/2014 |
|---|---|---|
| CN | 206349366 U | 7/2017 |

(Continued)

OTHER PUBLICATIONS

Invitation to Respond to Written Opinion issued by Intellectual Property Office of Singapore dated Aug. 3, 2020 for Application No: 10201910377T.

(Continued)

*Primary Examiner* — Koosha Sharifi-Tafreshi
(74) *Attorney, Agent, or Firm* — Tim Tingkang Xia, Esq.; Locke Lord LLP

(57) ABSTRACT

A light emitting diode (LED) display panel includes a back plate and a pixel structure, which includes multiple pixels. Each pixel includes a reflector structure and two LEDs emitting light of a same color, all disposed on the back plate. The reflector structure of each pixel has a first reflective bank structure and a second reflective bank structure. The first reflective bank structure has a first bank opening. The second reflective bank structure has a second bank opening. The two LEDs are disposed within the first and second bank openings. The first bank opening has a first shape, and the (Continued)

second bank opening has a second shape, which is a mirror shape or a 180° symmetrical shape of the first shape. For each of the pixels, the first shape is a polygonal shape, and at least two corners of the first shape have an included angle less than 90°.

17 Claims, 35 Drawing Sheets

(56) References Cited

U.S. PATENT DOCUMENTS

| | | |
|---|---|---|
| 2018/0090058 A1 | 3/2018 | Chen et al. |
| 2018/0182828 A1 | 6/2018 | Kim |
| 2020/0098957 A1* | 3/2020 | Pang .................... H01L 33/486 |

FOREIGN PATENT DOCUMENTS

| | | |
|---|---|---|
| CN | 108258013 A | 7/2018 |
| TW | 201319692 A | 5/2013 |
| TW | 201820303 A | 6/2018 |

OTHER PUBLICATIONS

Office Action issued by (TIPO) Intellectual Property Office Ministry of Economic Affairs R.O.C. dated Oct. 13, 2020 for Application No. 109102018, Tawian.

* cited by examiner

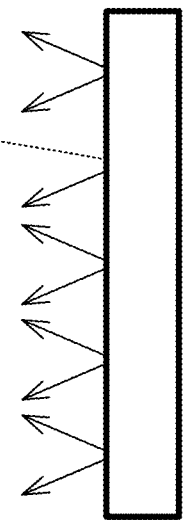
FIG. 2B
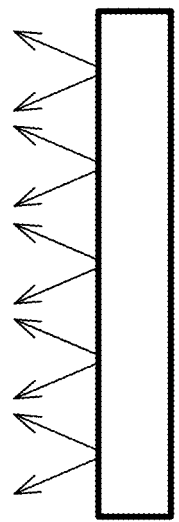
FIG. 2D
FIG. 2A
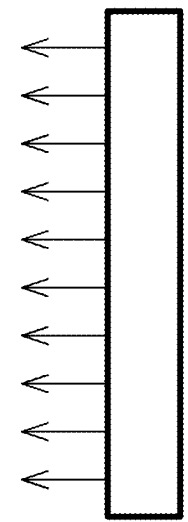
FIG. 2C

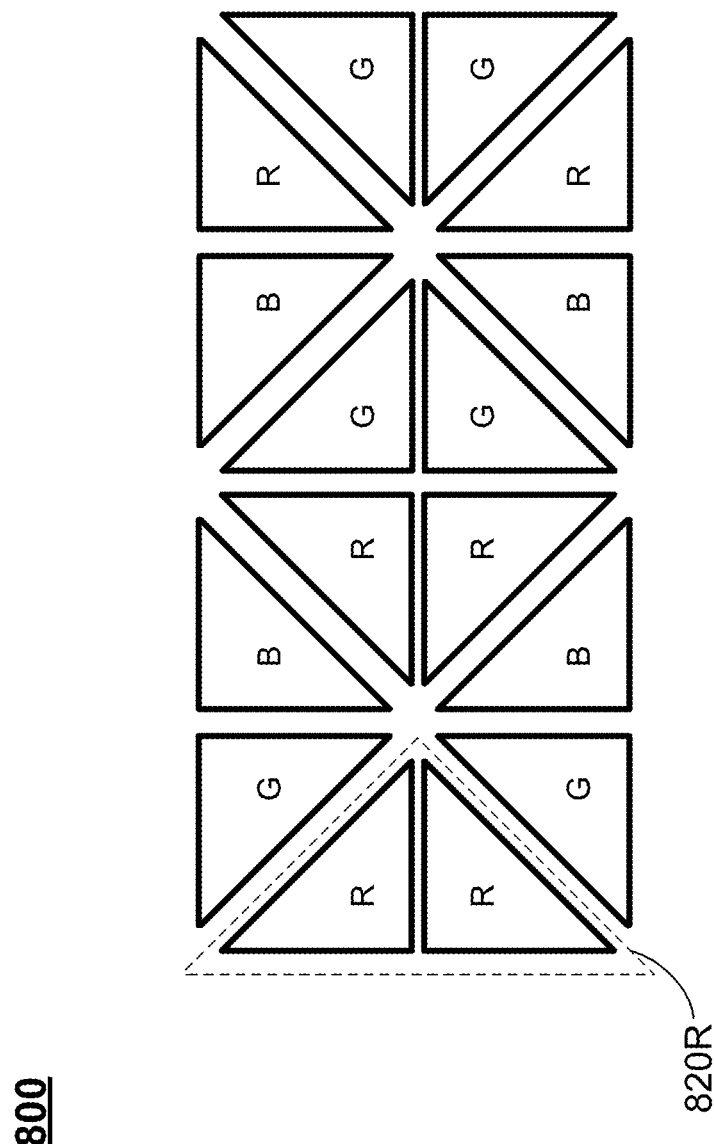

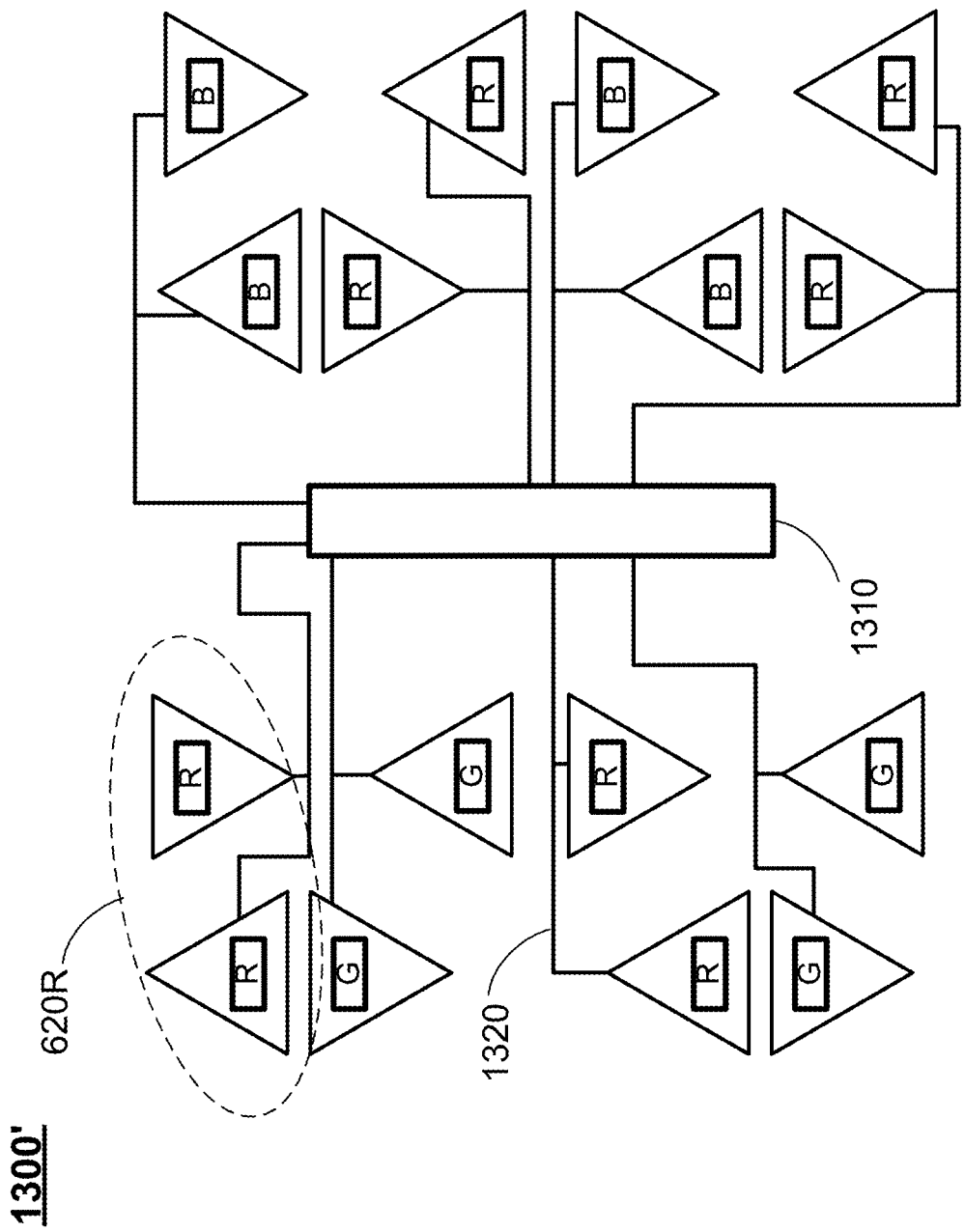

PIXEL ARRANGEMENT AND REFLECTOR STRUCTURE OF LED DISPLAY AND METHOD OF FORMING SAME

FIELD

The disclosure relates generally to display technology, and more particularly to a pixel arrangement and reflector structure of a light emitting diode (LED) display and a method of forming the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With larger display resolution and size are required, the light emitting diode (LED) display apparatus has become one of the most popular display panels for high light emitting efficiency. The LEDs used in the LED display apparatus can be micro LEDs or mini LEDs. For example, a micro LED (µLED) display panel utilizes micro LEDs as the pixel units, which may be used as a display panel of any size, and the small size of the micro LEDs enable the micro LED display panel to achieve a high resolution, high brightness and high contrast.

However, due to the light emission patterns and characteristics of the LEDs without packaging and reflector structures thereof, the brightest viewing angle of the LEDs in a LED display panel is not at the normal viewing angle (i.e., angle 0°), which is perpendicular to the display panel. Further, the light emission patterns and characteristics of the LEDs corresponding to the pixels of the LED display panel are consistent. In this case, if any one of the LEDs functions abnormally, a user may easily observe the abnormal display caused by the abnormal LED.

Therefore, a heretofore unaddressed need exists in the art to address the aforementioned deficiencies and inadequacies.

SUMMARY

One aspect of the disclosure relates to a light emitting diode (LED) display panel, including: a back plate; and a pixel structure including a plurality of pixels, wherein each of the pixels includes: a reflector structure disposed on the back plate, the reflector structure having a first reflective bank structure and a second reflective bank structure, the first reflective bank structure having a first bank opening, and the second reflective bank structure having a second bank opening, wherein the first bank opening has a first shape, the second bank opening has a second shape, and the second shape is a mirror shape of the first shape or a 180° symmetrical shape of the first shape; and a first LED and a second LED disposed on the back plate and emitting light of a same color, wherein the first LED is disposed within the first bank opening of the first reflective bank structure, and the second LED is disposed within the second bank opening of the second reflective bank structure; wherein for each of the pixels, the first shape is a polygonal shape, and at least two corners of the first shape have an included angle less than 90°.

In certain embodiments, for each of the pixels, the first bank opening and the second bank opening are disposed to mirror each other along a first direction.

In certain embodiments, for each of the pixels in a first row, the first bank opening and the second bank opening are disposed to mirror each other along a first direction, and for each of the pixels in a second row adjacent to the first row, the first bank opening and the second bank opening are disposed to mirror each other along a second direction different from the first direction.

In certain embodiments, for each of the pixels, the shape of the first reflective bank structure is a triangle.

In certain embodiments, for each of the pixels, the first LED is disposed within an LED area in the first bank opening, the LED area has a similar triangular shape to the triangle forming the first shape, and vertices of the similar triangular shape of the LED area are located at midpoints of median lines connecting vertices of the first shape to a centroid of the first shape.

In certain embodiments, for each of the pixels, the first LED is located at the centroid of the first shape, and the second LED is correspondingly located at a centroid of the second shape.

In certain embodiments, the first shapes of the first bank openings of all of the pixels are identical.

In certain embodiments, for each of the pixels, the first shape of the first bank opening is a parallelogram or a trapezoid.

In certain embodiments, for each of the pixels, the first reflective bank structure has two first sidewalls located at two sides of the first bank opening, and along a sectional plane perpendicular to the back plate and crossing the first LED, each of the first sidewalls extends slantly outward from the back plate to define an acute angle α between the back plate and each of the first sidewalls, wherein the acute angle α is in a range between 20° and 80°.

In certain embodiments, the pixels include a plurality of red (R) pixels, a plurality of green (G) pixels, and a plurality of blue (B) pixels.

In certain embodiments, an area of the first bank opening of each of the B pixels is greater than an area of the first bank opening of each of the R pixels, and an area of the first bank opening of each of the B pixels is greater than the area of the first bank opening of each of the G pixels.

In certain embodiments, the area of the first bank opening of each of the R pixels is greater than the area of the first bank opening of each of the G pixels.

In certain embodiments, the area of the first bank opening of each of the G pixels is greater than the area of the firs bank opening of each of the R pixels.

In certain embodiments, the first shapes of the first bank openings of the R pixels are identical, the first shapes of the first bank openings of the G pixels are identical, and the first shapes of the first bank openings of the B pixels are identical.

In certain embodiments, the first shapes of the first bank openings of at least two of the R pixels are different from each other, the first shapes of the first bank openings of at least two of the G pixels are different from each other, and the first shapes of the first bank openings of at least two of the B pixels are different from each other.

In certain embodiments, for each of the pixels, the first reflective bank structure and the second reflective bank structure are connected to each other.

In certain embodiments, for each of the pixels, the first reflective bank structure and the second reflective bank structure are separated from each other.

In certain embodiments, the LED display panel further includes an active driving layer having a plurality of driving units, wherein each of the driving units is configured to drive a corresponding one of the pixels, and each of the driving units has a shape different from a combination of the first shape of the first bank opening and the second shape of the second bank opening of the corresponding one of the pixels.

In certain embodiments, the shape of each of the driving units is a rectangle, a square, a triangle, or a combination thereof.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 2A schematically shows light emission patterns of a LED display panel according to certain embodiments of the present disclosure, where all of the LEDs of the LED display panel emit light toward an identical normal viewing angle.

FIG. 2B schematically shows light emission patterns of the LED display panel as shown in FIG. 2A, where one of the LEDs functions abnormally.

FIG. 2C schematically shows light emission patterns of a LED display panel according to certain embodiments of the present disclosure, where the LEDs of the LED display panel are adjusted to emit light toward different viewing angles.

FIG. 2D schematically shows light emission patterns of the LED display panel as shown in FIG. 2C, where one of the LEDs functions abnormally.

FIG. 8A schematically shows a pixel structure of a LED display panel according to certain embodiments of the present disclosure.

FIG. 13B schematically shows connections between a driver IC and pixels in the pixel structure as shown in FIG. 6 according to certain embodiments of the present disclosure.

DETAILED DESCRIPTION OF THE DISCLOSURE

Figure 1B:
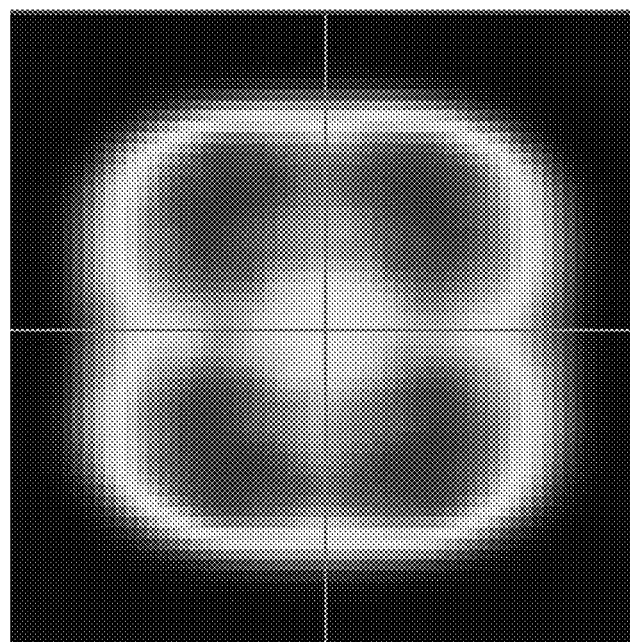
FIG. 1B shows the intensity of angular distribution of the sub-pixel as shown in FIG. 1A according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a display device structure for wireless communication having one or more antennas on the side surface thereof.

Figure 1A:
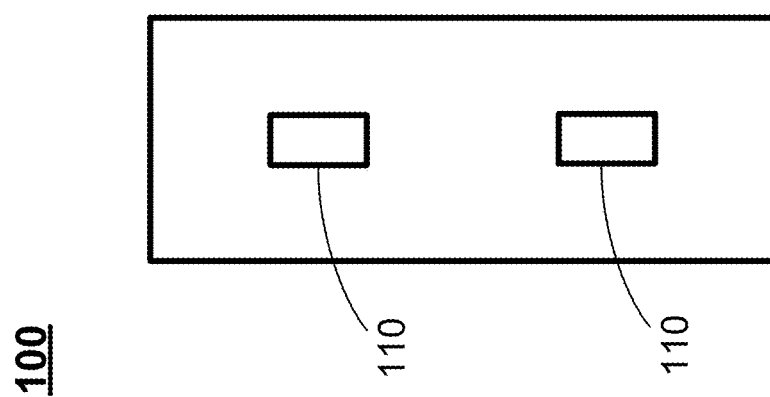
FIG. 1A schematically shows a sub-pixel of a LED display panel according to certain embodiments of the present disclosure.
Figure 1C:
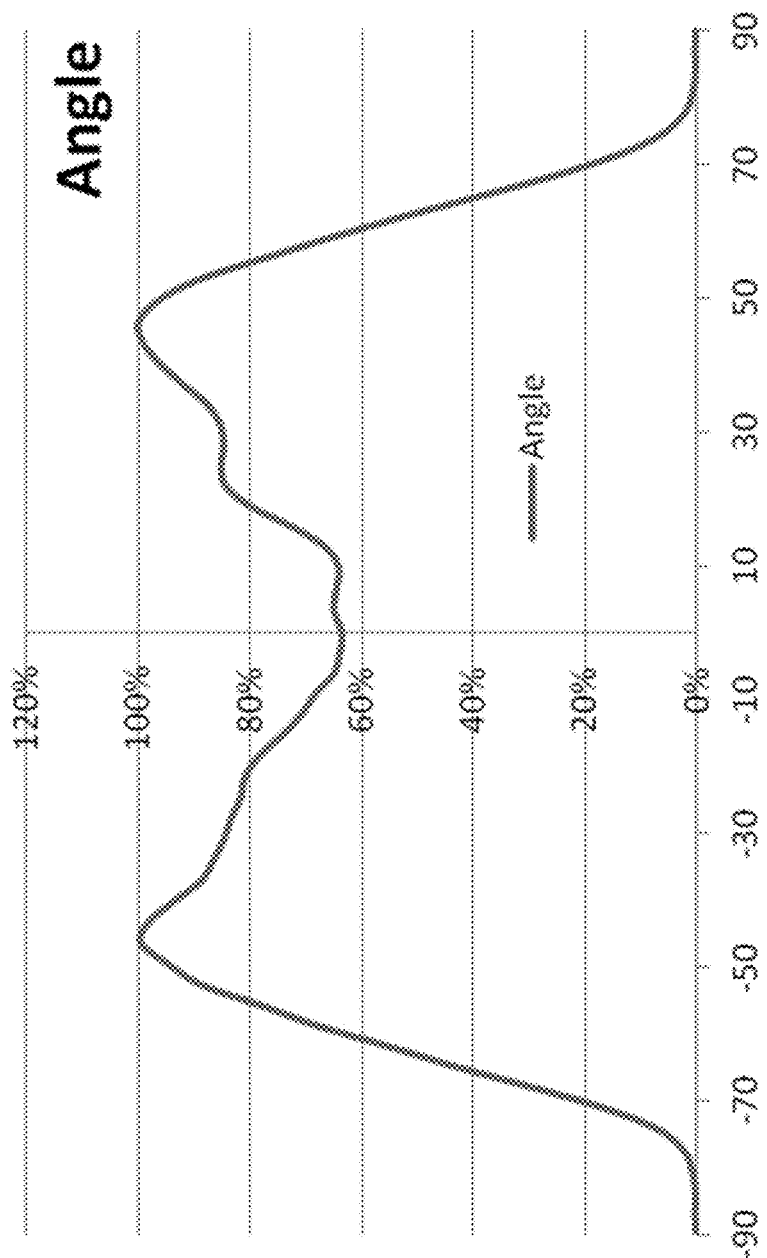
FIG. 1C shows a chart showing the brightness to viewing angle of the sub-pixel as shown in FIG. 1A according to certain embodiments of the present disclosure.

As described above, due to the light emission patterns and characteristics of the LEDs without packaging and reflector structures thereof, the brightest viewing angle of the LEDs in a LED display panel is not at the normal viewing angle (i.e., angle 0°). For example, FIG. 1A schematically shows a sub-pixel of a LED display panel according to certain embodiments of the present disclosure. As shown in FIG. 1A, the sub-pixel 100 includes two LEDs 110. FIGS. 1B and 1C shows the intensity of angular distribution of the sub-pixel 100 as shown in FIG. 1A. It should be noted that the intensity of angular distribution of the sub-pixel 100 as shown in FIG. 1B is obtained from the two LEDs 110 of the sub-pixel 100, without any packaging structure or reflector structure (also known as the reflective bank structure). As shown in FIGS. 1B and 1C, the brightest viewing angle of the LEDs 110 of the sub-pixel is around 45° and −45°, where the brightness is close to 100%. In contrast, at the normal viewing angle (i.e., angle 0°), the brightness is only about 65%.

Further, as discussed above, the light emission patterns and characteristics of the LEDs corresponding to the pixels of the LED display panel are consistent. For example, FIG. 2A shows schematically shows light emission patterns of a LED display panel according to certain embodiments of the present disclosure. As shown in FIG. 2A, all of the LEDs of the LED display panel 200 emit light toward an identical normal viewing angle. In this case, if one LED 210 of the LED display panel 200 functions abnormally, as shown in FIG. 2B, a user may easily observe the abnormal display caused by the abnormal LED 210.

In view of the above deficiencies, one aspect of the present disclosure relates to a LED display panel, where the LEDs of the LED display panel are adjusted by the corresponding reflector structures to emit light toward different viewing angles. For example, FIG. 2C schematically shows light emission patterns of a LED display panel according to certain embodiments of the present disclosure. As shown in FIG. 2C, in the LED display panel 200', the LEDs of the LED display panel 200' are adjusted to emit light toward different viewing angles. In this case, the intensity of angular distribution of the pixels formed by the LEDs can be adjusted. Further, if one LED 210' of the LED display panel 200' functions abnormally, as shown in FIG. 2D, a user may not easily observe the abnormal display caused by the abnormal LED 210' in comparison to the case as shown in FIG. 2B.

Figure 3A:
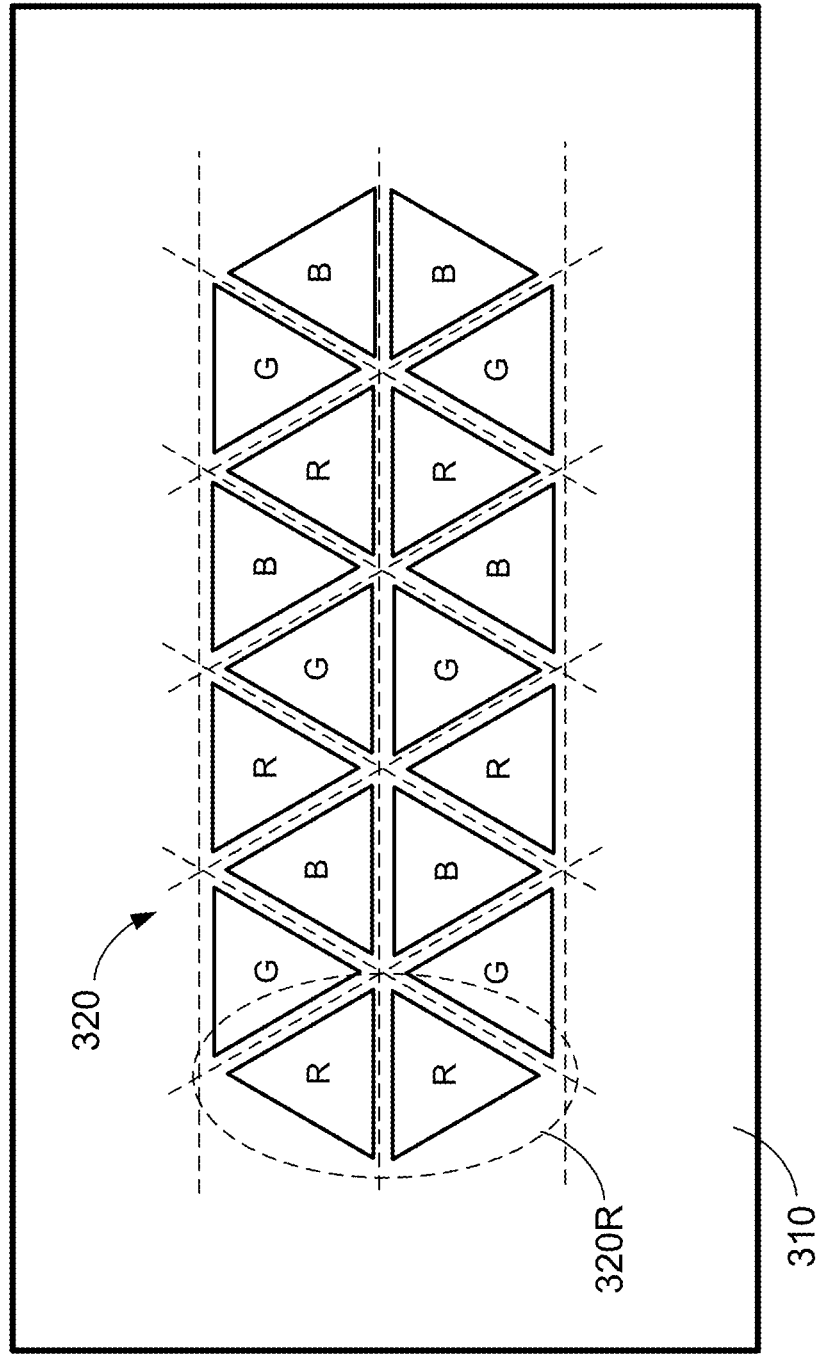
FIG. 3A schematically shows a pixel structure of a LED display panel according to certain embodiments of the present disclosure.

In view of the above deficiencies, certain aspect of the present disclosure relates to a LED display panel, which utilizes a reflector structure with a shape specifically designed to adjust the light emission directions of the LEDs in a way similar to that as shown in FIG. 2C. For example, FIG. 3A schematically shows a pixel structure of a LED display panel according to certain embodiments of the present disclosure. It should be noted that the pixel structure as shown in FIG. 3A merely indicates the units formed by LEDs and corresponding structures, and may not include the driving units or components below these structures. As shown in FIG. 3A, the LED display panel 300 includes a back plate 310 and a pixel structure 320 disposed on the back plate 310. Specifically, the pixel structure 320 include a plurality of red (R) pixels, a plurality of green (G) pixels, and a plurality of blue (B) pixels. In particular, FIG. 3B schematically shows a R pixel 320R as shown in FIG. 3A. As shown in FIG. 3B, the R pixel 320R includes two sub-pixel portions 320A and 320B, which are mirror structures to each other. For the first sub-pixel portion 320A, a first reflective bank structure 330A is disposed on the back plate (not shown in FIG. 3B), and for the second sub-pixel portion 320B, a second reflective bank structure 320B is disposed on the back plate (not shown in FIG. 3B). The first reflective bank structure 330A and the second reflective bank structure 330B are formed by reflective light resist materials. As shown in FIG. 3B, the first reflective bank structure 330A and the second reflective bank structure 330B are separated from each other, and collectively form a reflector structure of the R pixel 320R, where each of the first reflective bank structure 330A and the second reflective bank structure 330B is in the shape of an equilateral triangle, and each corner of the equilateral triangular shape has an included angle of 60°. Specifically, the equilateral triangular shapes of the first reflective bank structure 330A and the second reflective bank structure 330B mirror to each other along a column direction (i.e., the vertical direction as shown in FIG. 3B). In other words, the equilateral triangular shape of the second reflective bank structure 330B is a mirror shape of the equilateral triangular shape of the first reflective bank structure 330A. The first reflective bank structure 330A has a first bank opening 335A, and the second reflective bank structure 330B has a second bank opening 335B respectively exposing the back plate, such that a first red LED (R-LED) 340A is disposed in a LED area 338A within the first bank opening 335A, and a second R-LED 340B is disposed in a LED area 338B within the second bank opening 335B. The shape of the first bank opening 335A and the shape of the second bank opening 335B are also equilateral triangles, and the equilateral triangular shapes of the first bank opening 335A and the second bank opening 335B mirror to each other along the column direction (i.e., the vertical direction as shown in FIG. 3B).

Referring back to FIG. 3A, for each of the R pixels, G pixels and B pixels in the pixel structure 320, the arrangement of the sub-pixel portions are similar to the R pixel 320R as shown in FIG. 3B. In other words, for each of the pixels in the pixel structure 320, the equilateral triangular shapes of the first bank opening 335A and the second bank opening 335B mirror to each other along the same column direction (i.e., the vertical direction as shown in FIG. 3A).

Figure 3C:
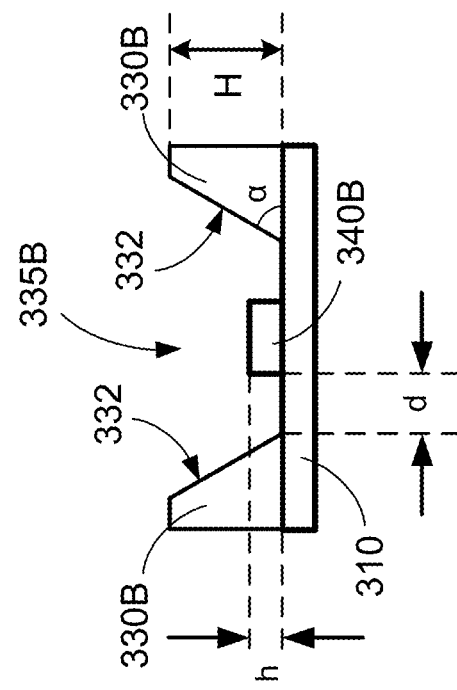
FIG. 3C schematically shows a sectional view of the pixel as shown in FIG. 3B along the A-A line according to one embodiment of the present disclosure.
Figure 3B:
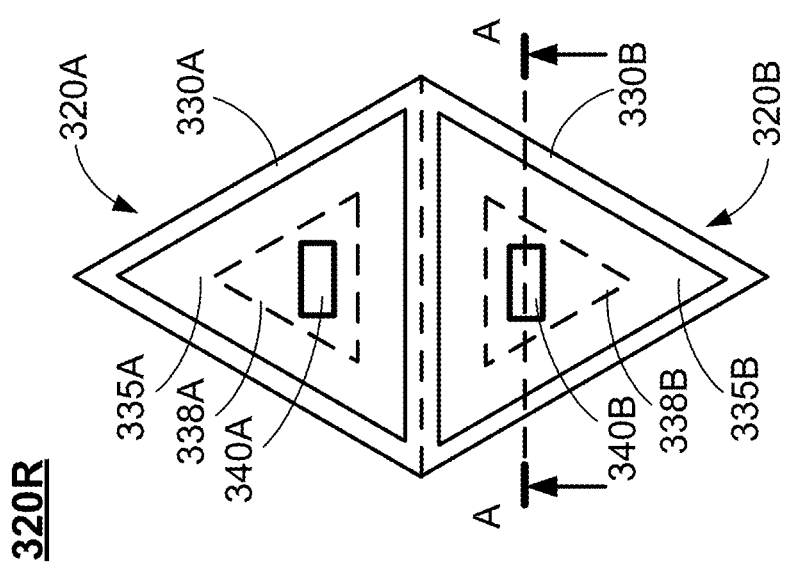
FIG. 3B schematically shows a pixel as shown in FIG. 3A according to one embodiment of the present disclosure.

FIG. 3C schematically shows a sectional view of the R pixel 320R as shown in FIG. 3B along the A-A line. It should be noted that the sectional view of FIG. 3C shows a cross-section of the second sub-pixel portion 320B along a sectional plane perpendicular to the back plate 310 and crossing the second LED 340B. Since the first sub-pixel portion 320A is a mirror structure of the second sub-pixel portion 320B, details of the cross-section of the first sub-pixel portion 320A will be similar to the cross-section of the second sub-pixel portion 320B, and thus are not elaborated herein.

As shown in FIG. 3C, the second reflective bank structure 330B has two first sidewalls 332 symmetrically located at two sides of the second bank opening 335B. Each of the first sidewalls 332 extends slantly outward from the back plate 310, thus defining an acute angle α between the back plate 310 and each of the first sidewalls 332. In certain embodiments, the acute angle α is in a range between 20° and 80°. In one embodiment, the acute angle α is 68°. The second LED 340B is located between the two first sidewalls 332, and the distance of the second LED 340B to each of the first sidewalls 332 is d. The height of the second LED 340B is h, and the height of the second reflective bank structure 330B is H. In certain embodiments, H>15 Under such design structure, the second LED 340B and the second reflective bank structure 330B may have better optical effects.

Figure 3D:
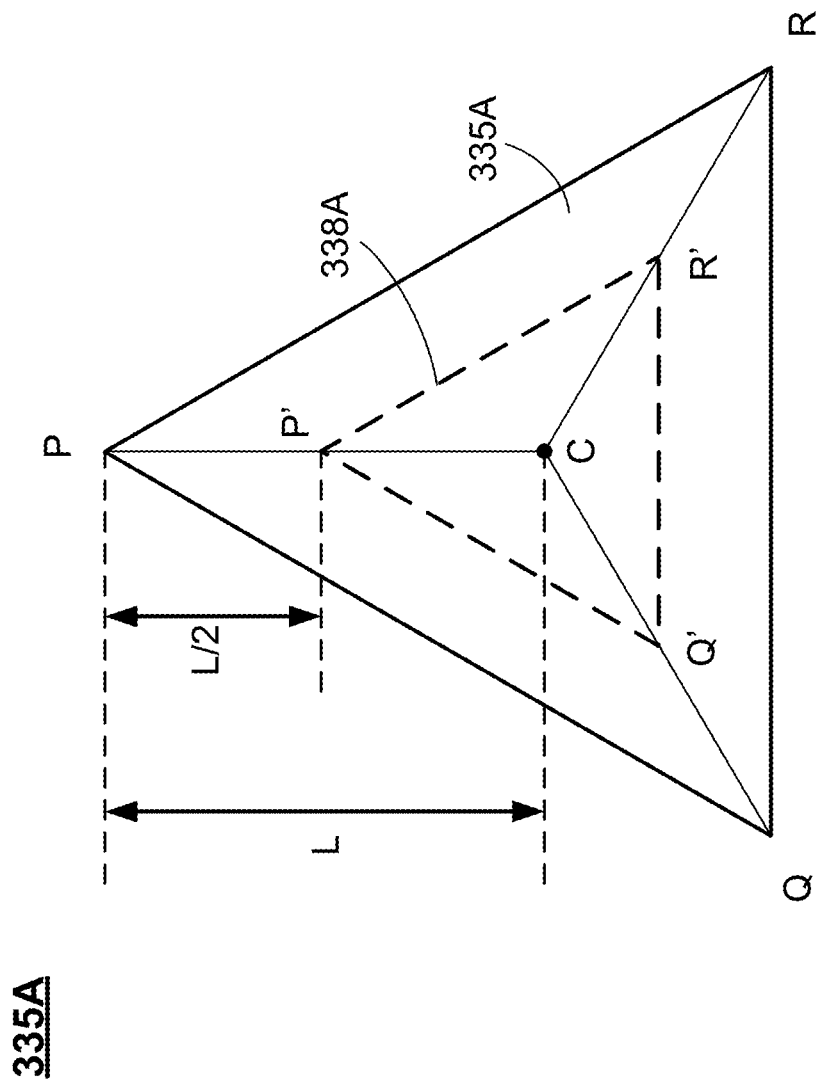
FIG. 3D schematically shows a shape of a bank opening as shown in FIG. 3B according to certain embodiments of the present disclosure.

FIG. 3D schematically shows a shape of the first bank opening 335A of the R pixel 320R as shown in FIG. 3B according to certain embodiments of the present disclosure. It should be noted that FIG. 3D shows the shapes of the first bank opening 335A and the corresponding LED area 338A. Since the second bank opening 335B is a mirror structure of the first bank opening 335A, details of the shapes of the second bank opening 335B and the corresponding LED area 338B will be similar to the shapes as shown in FIG. 3D, and thus are not elaborated herein. As shown in FIG. 3D, the shape of the LED area 338A is a similar triangle to the equilateral triangular shape of the first bank opening 335A. In particular, the first bank opening 335A has an equilateral triangular shape ΔPQR, and the LED area 338A has a similar equilateral triangular shape ΔP'Q'R'. In this case, the vertices P', Q' and R' of the similar equilateral triangular shape of the LED area 338A are located at midpoints of the median lines connecting the vertices P, Q, R of the equilateral triangular shape of the first bank opening 335A to a centroid C of the equilateral triangular shape of the first bank opening 335A. Thus, for the median line connecting the centroid C to the top vertex P of the equilateral triangular shape of the first bank opening 335A, the vertex P' of the similar equilateral triangular shape of the LED area 338A is located at its midpoint. In other words, the length from the vertex P to the vertex P' is L/2, which is one half of the length L from the vertex P to the centroid C. Accordingly, the first LED 340A may be located in the LED area 338A enclosed by the equilateral triangular shape ΔP'Q'R'. In certain embodiments, for example, the first LED 340A may be located at the centroid C of the equilateral triangular shape of the first bank opening 335A.

Figure 3E:
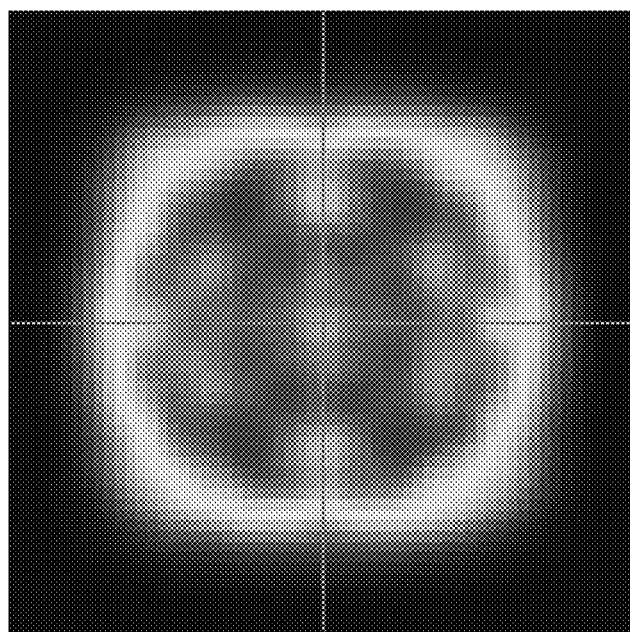
FIG. 3E shows the intensity of angular distribution of the pixel as shown in FIG. 3B according to certain embodiments of the present disclosure.

FIG. 3E shows the intensity of angular distribution of the pixel as shown in FIG. 3B according to certain embodiments of the present disclosure. As shown in FIG. 3E, with the adjustment of the reflector structure of the pixel 320R, the brightness at the normal viewing angle (i.e., angle 0°) in each direction is significantly increased in comparison to the intensity of angular distribution as shown in FIG. 1B.

Figure 3F:
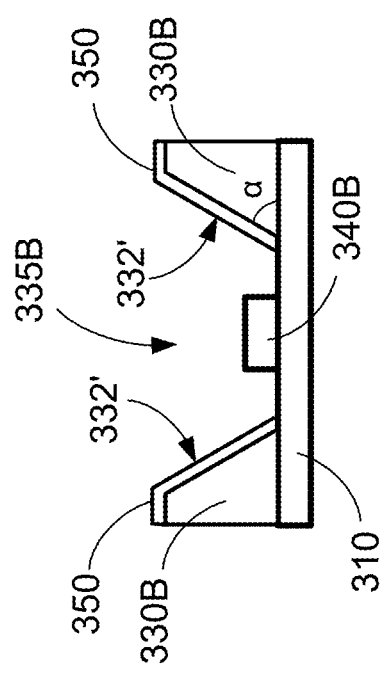
FIG. 3F schematically shows a sectional view of the pixel as shown in FIG. 3B along the A-A line according to another embodiment of the present disclosure.

As discussed above, the first reflective bank structure 330A and the second reflective bank structure 330B are formed by reflective light resist materials. In certain embodiments, a metal reflective layer may be formed on the first reflective bank structure 330A and the second reflective bank structure 330B. For example, FIG. 3F schematically shows a sectional view of the pixel as shown in FIG. 3B along the A-A line according to another embodiment of the present disclosure. Specifically, the difference between the cross-section as shown in FIG. 3F from the cross-section as shown in FIG. 3C exists in that a metal layer 350 is disposed on the second reflective bank structure 330B, such that the two first sidewalls 332' are formed by the metal layer 350. Other structures of the cross-section as shown in FIG. 3F are identical to the corresponding structures with the same reference numbers in the cross-section as shown in FIG. 3C, and thus are not elaborated herein.

As discussed above, the shape of the first bank opening 335A is an equilateral triangle, and the second bank opening 335B, which is a mirror structure of the first bank opening 335A, is also equilateral triangular shaped. Thus, as shown in FIG. 3A, for all of the pixels in the pixel structure 320, the first bank opening and the second bank opening can be all equilateral triangular shaped. In other words, the shapes of the first bank openings of all of the pixels in the pixel structure 320 are identical.

Figure 4:
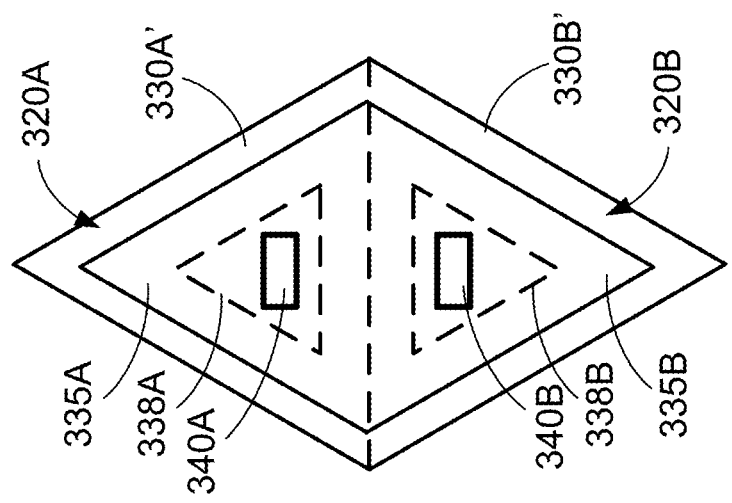
FIG. 4 schematically shows a pixel as shown in FIG. 3A according to another embodiment of the present disclosure.

In the embodiment as shown in FIG. 3B, the first reflective bank structure 330A and the second reflective bank structure 330B are separated from each other. In certain embodiments, the first reflective bank structure 330A and the second reflective bank structure 330B may be connected to each other, such that the first bank opening 335A and the second bank opening 335B are closer to each other. In certain embodiments, FIG. 4 schematically shows a pixel as shown in FIG. 3A according to another embodiment of the present disclosure. Specifically, the only difference between the pixel 400 as shown in FIG. 4 from the pixel 320R as shown in FIG. 3B exists in that the first bank opening 335A and the second bank opening 335B are not separate openings. In other words, the first bank opening 335A and the second bank opening 335B collectively form one opening. Other structures of the pixel 340, including the LED areas 338A and 338B and the LEDs 340A and 340B, are identical to the corresponding structures with the identical reference numbers in the pixel 320R as shown in FIG. 3B, and thus are not elaborated herein.

Figure 5A:
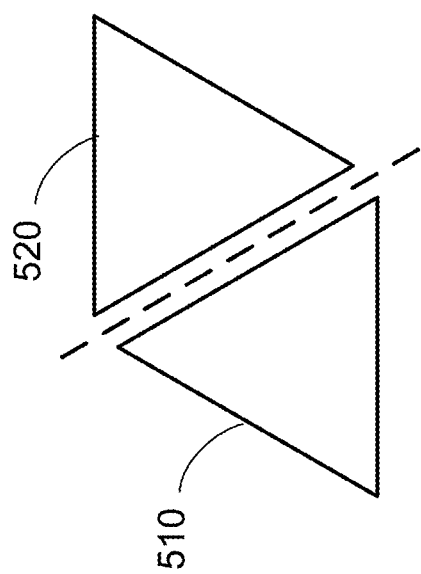
FIG. 5A schematically shows bank openings of a pixel according to one embodiment of the present disclosure.
Figure 5B:
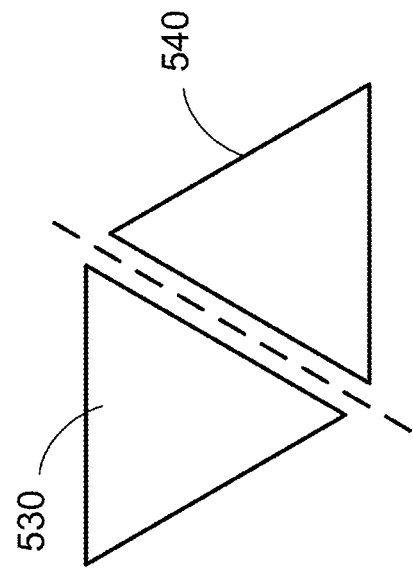
FIG. 5B schematically shows bank openings of a pixel according to another embodiment of the present disclosure.

In the embodiment as shown in FIG. 3A, for all of the pixels in the pixel structure 320, including the R pixels, G pixels and B pixels, the first bank opening and the second bank opening of each pixel are disposed to mirror each other along the same column direction, as shown in FIG. 3B. However, due to the equilateral triangular shape of the first bank opening and the second bank opening of each pixel, the mirror direction of the first bank opening and the second bank opening of each pixel may vary, allowing the pixels to be arranged differently in the pixel structure 320. For example, FIGS. 5A and 5B schematically shows two bank openings of a pixel according to two embodiments of the present disclosure. As shown in FIG. 5A, the first bank opening 510 and the second bank opening 520 mirror to each other along a rightward slant direction. As shown in FIG. 5B, the first bank opening 530 and the second bank opening 540 mirror to each other along a leftward slant direction. It should be noted that the different arrangement of the pixel does not significantly change the intensity of angular distribution of the pixel. In other words, the intensity of angular distribution of the pixel as shown in FIG. 3B will remain the same if the locations of the first bank opening and the second bank opening of the pixel are rearranged in a way as shown in FIG. 5A or FIG. 5B.

Figure 6:
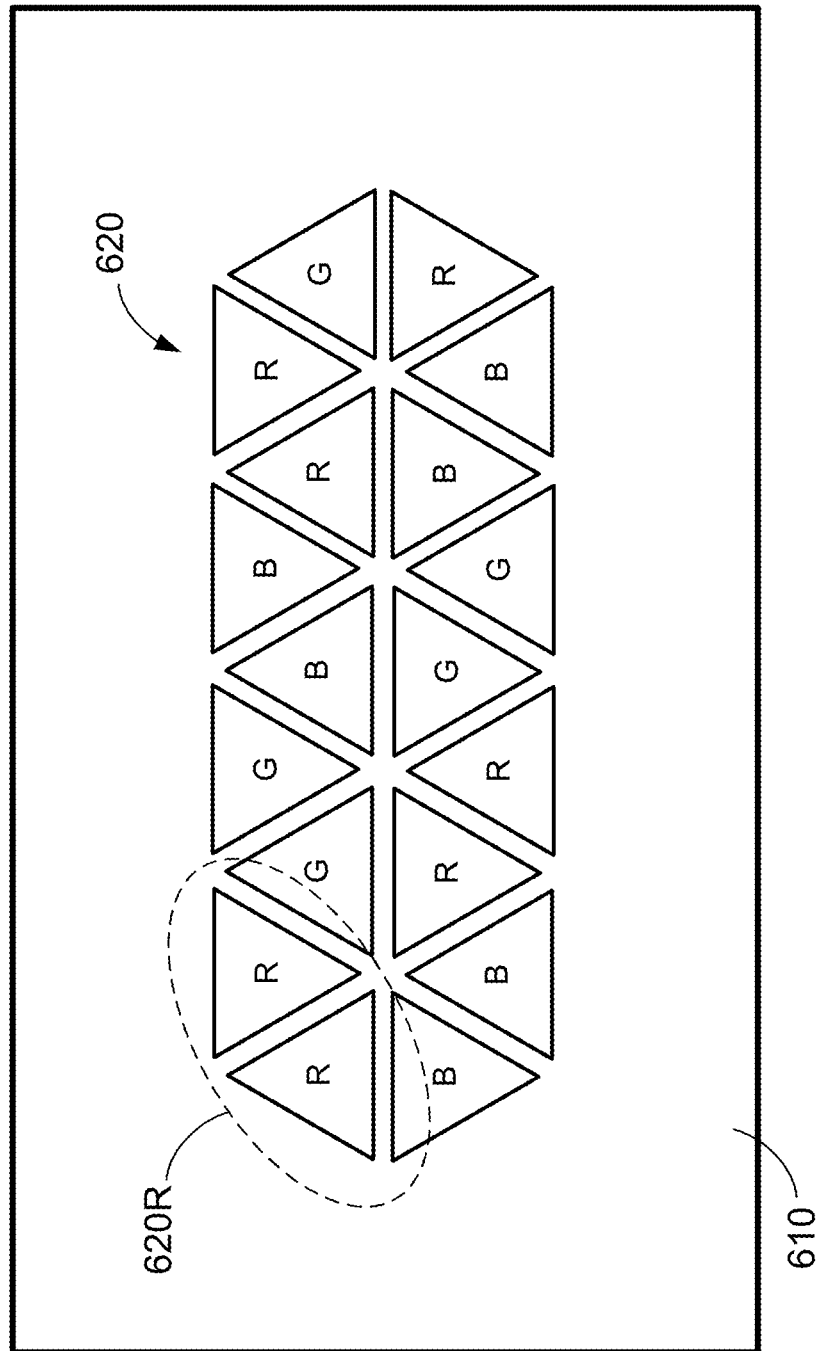
FIG. 6 schematically shows a pixel structure of a LED display panel according to certain embodiments of the present disclosure.

FIG. 6 schematically shows a pixel structure of a LED display panel according to certain embodiments of the present disclosure. As shown in FIG. 6, the LED display panel 600 includes a back plate 610 and a pixel structure 620 disposed on the back plate 610. Specifically, the difference between the pixel structure 620 as shown in FIG. 6 and the pixel structure 320 as shown in FIG. 3A exists in the mirror directions of the mirror direction of the first bank opening and the second bank opening of each pixel. In particular, as shown in FIG. 6, the pixels of the pixel structure 620 are arranged in a top row and a bottom row. In the top row, each of the pixels are arranged in a rightward slant direction, similar to that as shown in FIG. 5A, and in the bottom row, each of the pixels are arranged in a leftward slant direction, similar to that as shown in FIG. 5B. In other words, for each of the pixels in the same row, the mirror direction of the first bank opening and the second bank opening of each pixel is identical, but the mirror directions of the two adjacent rows are different from each other. Further, as shown in FIG. 6, for the R pixel 620R in the top row, the adjacent pixel in the bottom row is a B pixel, allowing any two adjacent pixels in the pixel structure 620 to be pixels in different colors. In other words, any two adjacent pixels in the pixel structure 620 emit light with different wavelengths (i.e., in different colors).

Figure 7B:
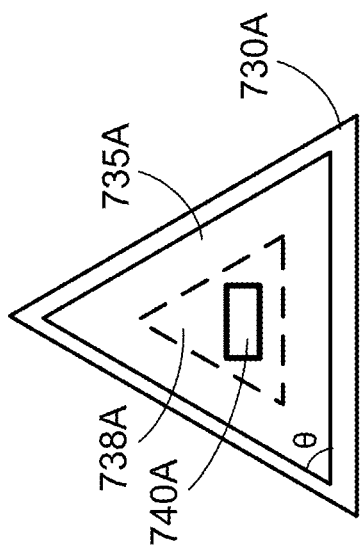
FIG. 7B shows the first sub-pixel portion of FIG. 7A.
Figure 7A:
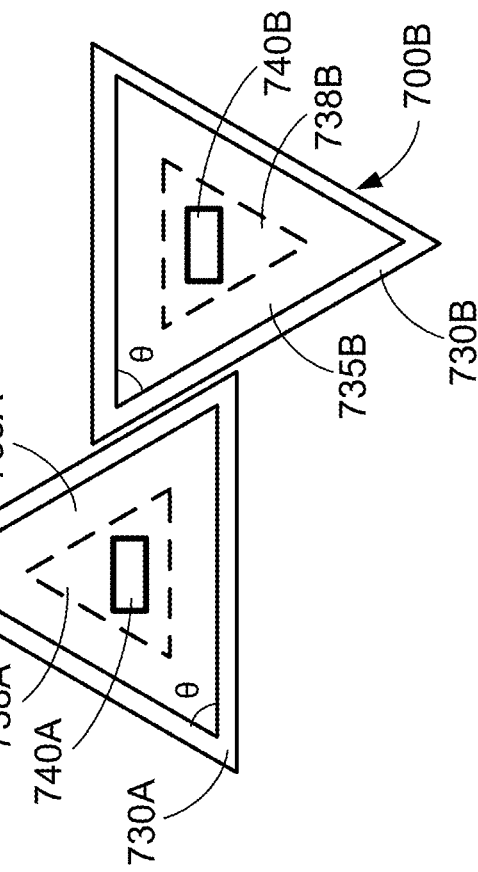
FIG. 7A schematically shows a pixel according to one embodiment of the present disclosure.

In the embodiment as shown in FIGS. 3A and 3B, the first bank opening and the second bank opening of each pixel are equilateral triangular shaped. In certain embodiments, the shapes of the first bank opening and the second bank opening of each pixel may be changed to isosceles triangles, which allow the arrangement of the pixels in the pixel structure 320 to remain substantially similar. For example, FIG. 7A schematically shows a pixel according to one embodiment of the present disclosure, and FIG. 7B shows the first sub-pixel portion of FIG. 7A. As shown in FIGS. 7A and 7B, the pixel 700 includes two sub-pixel portions 700A and 700B, which are mirror structures to each other. It should be noted that, due to the different locations of the two sub-pixel portions 700A and 700B, the first reflective bank structure 730A and the second reflective bank structure 730B can be separate structures. In addition, the only other difference between the two sub-pixel portions 700A and 700B as shown in FIG. 7A and the sub-pixel portions 320A and 320B as shown in FIG. 7B exists in that the bottom corners of the triangular shape of the first bank opening 735A has an included angle of θ. The value of θ may be variable such that the shape of the first bank opening 735A (and the mirror shape of the second bank opening) is an isosceles triangle. When 0 is 60°, the shape of the first bank opening 735A is an equilateral triangle, which is identical to that as shown in FIG. 3B. Since the LED area 738A is formed as a similar triangle to the shape of the first bank opening 735A, the shape of the LED area 738A will also be variable based on the value of 0. In certain embodiments, the shape of the first reflective bank structure 730A may also be variable accordingly. Other structures of the pixel 700, including the first LED 740A of the first sub-pixel portion 700A, are similar to the corresponding structures as shown in FIG. 3B, and are thus not elaborated herein.

Figure 7C:
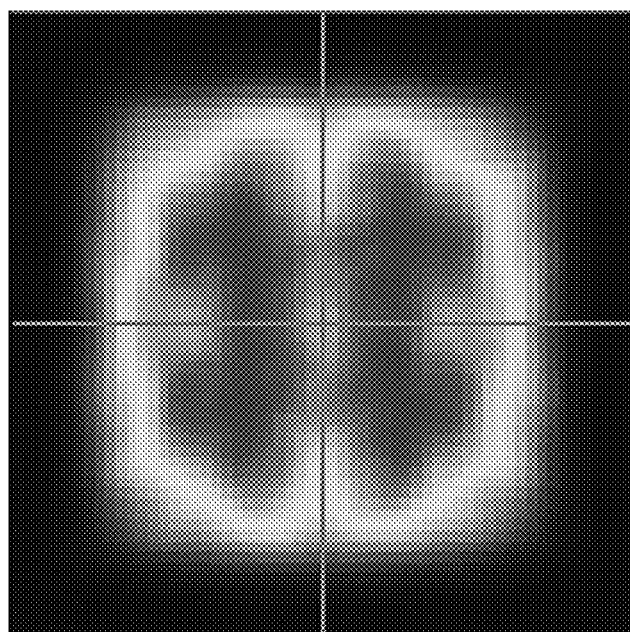
FIG. 7C shows the intensity of angular distribution of a pixel as shown in FIG. 7B according to certain embodiments of the present disclosure, where θ=40°.
Figure 7D:
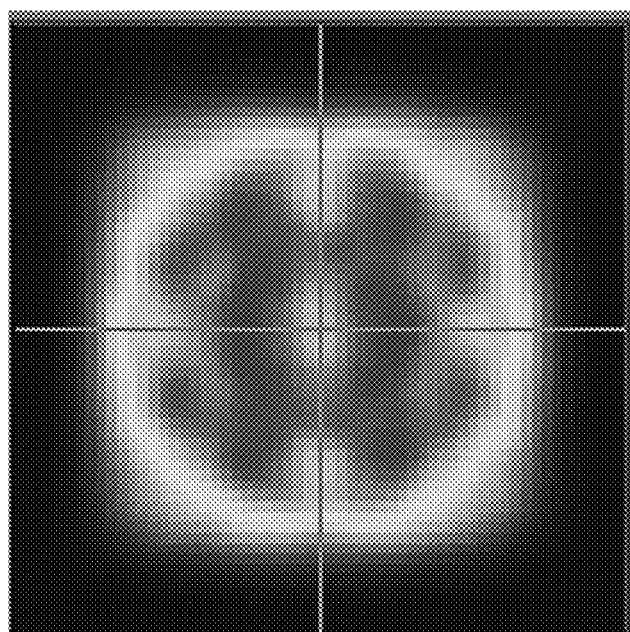
FIG. 7D shows the intensity of angular distribution of a pixel as shown in FIG. 7B according to certain embodiments of the present disclosure, where θ=50°.
Figure 7E:
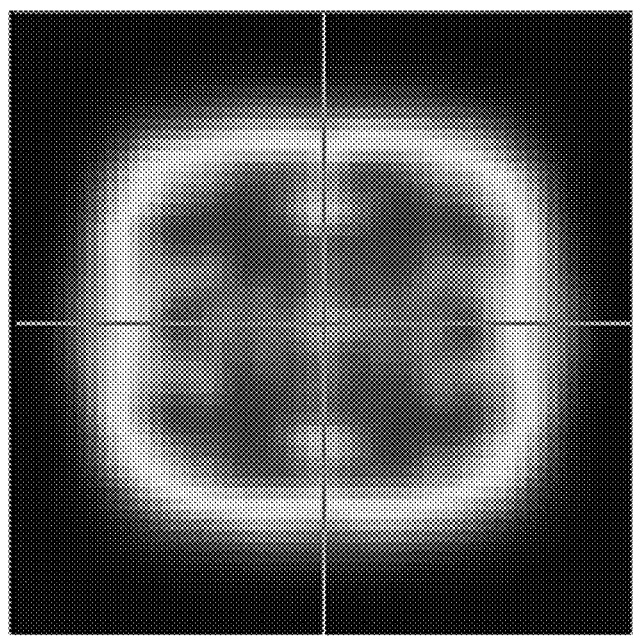
FIG. 7E shows the intensity of angular distribution of a pixel as shown in FIG. 7B according to certain embodiments of the present disclosure, where θ=70°.
Figure 7F:
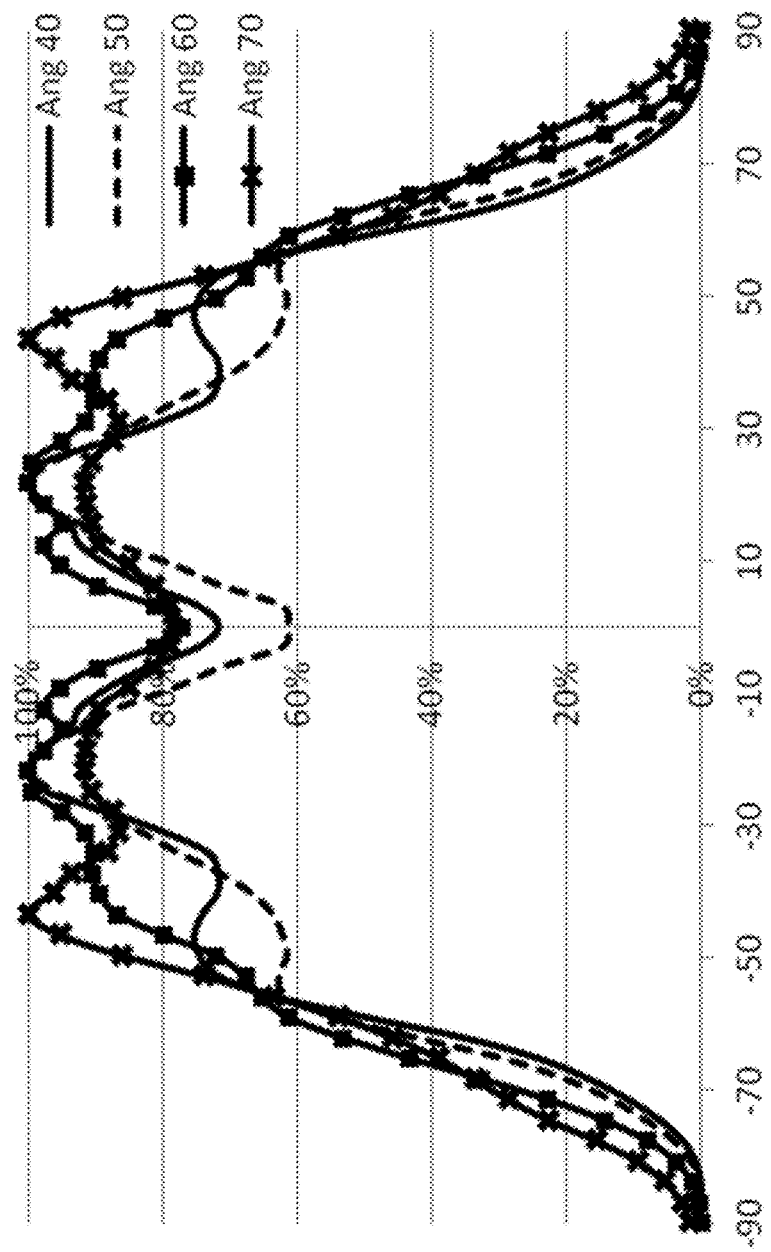
FIG. 7F shows a chart showing the brightness to viewing angle of the pixel as shown in FIG. 7A according to certain embodiments of the present disclosure.
Figure 7G:
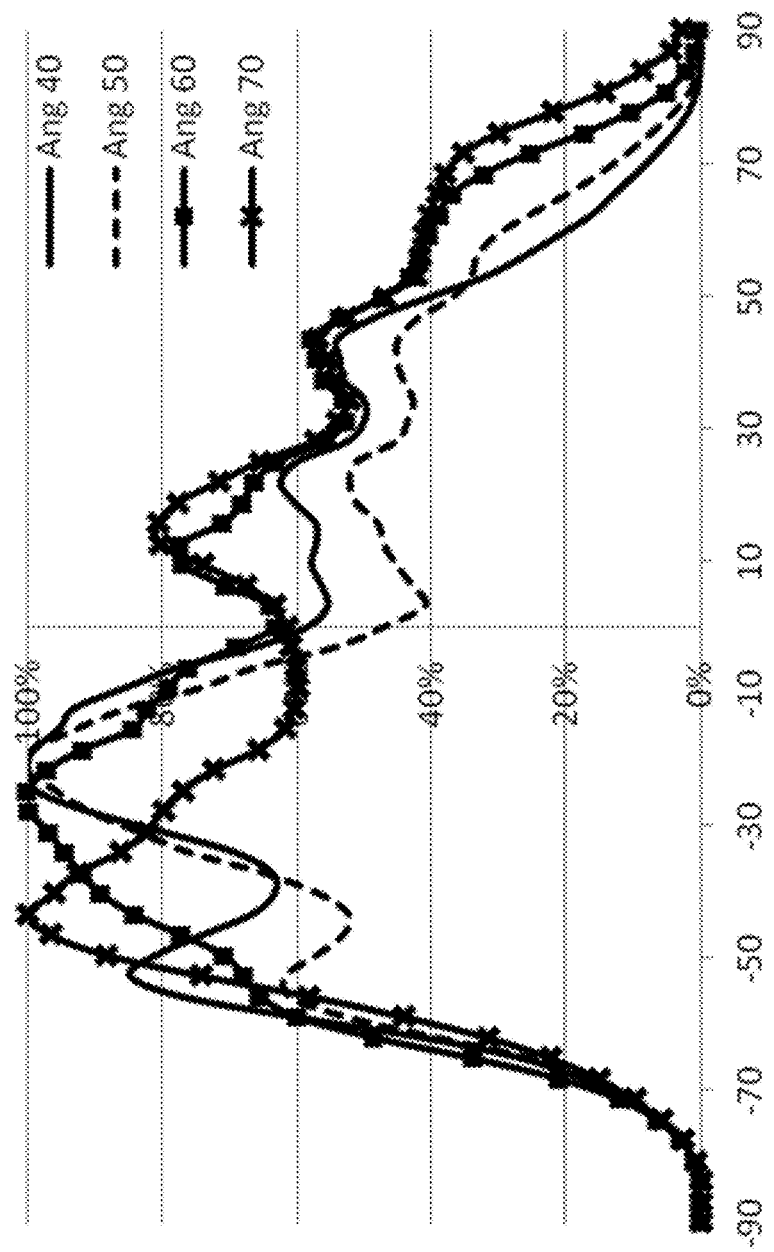
FIG. 7G shows a chart showing the brightness to viewing angle of the first sub-pixel portion as shown in FIG. 7B according to certain embodiments of the present disclosure.

FIGS. 7C, 7D, 7E, 7F and 7G shows the intensity of angular distributions of the pixel 700 as shown in FIG. 7A. Specifically, FIGS. 7C, 7D and 7E respectively shows the intensity of angular distributions of the pixels as shown in FIG. 7B according to different embodiments of the present disclosure, where the values of 0 are different. In particular, FIG. 7C shows the intensity of angular distribution where θ=40°, FIG. 7D shows the intensity of angular distribution where θ=50°, and FIG. 7E shows the intensity of angular distribution where θ=70°. In all cases, the distance of the LEDs of the pixels to each of the corresponding sidewalls of the reflective bank structures remains the same value d, as shown in FIG. 3C. Further, FIG. 7F shows a chart showing the brightness to viewing angle of the pixel 700 as shown in FIG. 7A according to certain embodiments of the present disclosure, where the brightness data of θ=40° (corresponding to FIG. 7C), 50° (corresponding to FIG. 7D), 60° (corresponding to FIG. 3E) and 70° (corresponding to FIG. 7E) is provided. Correspondingly, in comparison to the data corresponding to the pixel as shown in FIG. 7F, FIG. 7G shows a chart showing the brightness to viewing angle of the first sub-pixel portion 700A as shown in FIG. 7B for comparison purposes. As shown in FIGS. 7C, 7D and 7E, with the adjustment of the reflector structure of the pixel 320R, the brightness at the normal viewing angle (i.e., angle 0°) in each direction is significantly increased in comparison to the intensity of angular distribution as shown in FIG. 1B. As shown in FIGS. 7F and 7G, in the cases where θ=40°, θ=50° or θ=60°, the brightest viewing angle of the LEDs of the pixel is closer to the normal viewing angle (i.e., angle 0°), and in the cases where θ=40°, θ=60° or θ=70°, the brightness at the normal viewing angle (i.e., angle) 0° may be increase to be around 80%, which is significant comparing to the percentage of 65% as shown in FIG. 1C.

In the embodiments as disclosed above, the shapes of the bank openings are all equilateral or isosceles triangles. In certain embodiments, other polygonal shapes may be used as the shapes of the bank openings. For example, the polygonal shapes may include, without being limited thereto, triangles, parallelograms, trapezoids, irregular trapeziums or quadrilaterals, as long as at least two corners of each of the polygonal shapes have an included angle less than 90°.

FIGS. 8A, 8B, 8C, 8D, 9, 10 and 11 schematically shows pixel structures of a LED display panel according to different embodiments of the present disclosure. For simplifying purposes, each drawing only shows the pixel structure, without showing the corresponding back plate. Further, for each pixel of the pixel structure, only the shapes of the bank openings are shown to represent the pixel, without showing the reflective bank structures and the LEDs of the pixels.

As shown in FIG. 8A, in the pixel structure 800, each pixel is formed by two bank openings in the shapes of right triangles mirroring each other along the column direction (i.e., the vertical direction as shown in FIG. 8A). Further, the first bank opening of the R pixel 820R and the adjacent first bank opening of the adjacent G pixel collectively form a square. In this case, the size and shape of each pixel in the pixel structure 800 is similar.

Figure 8B:
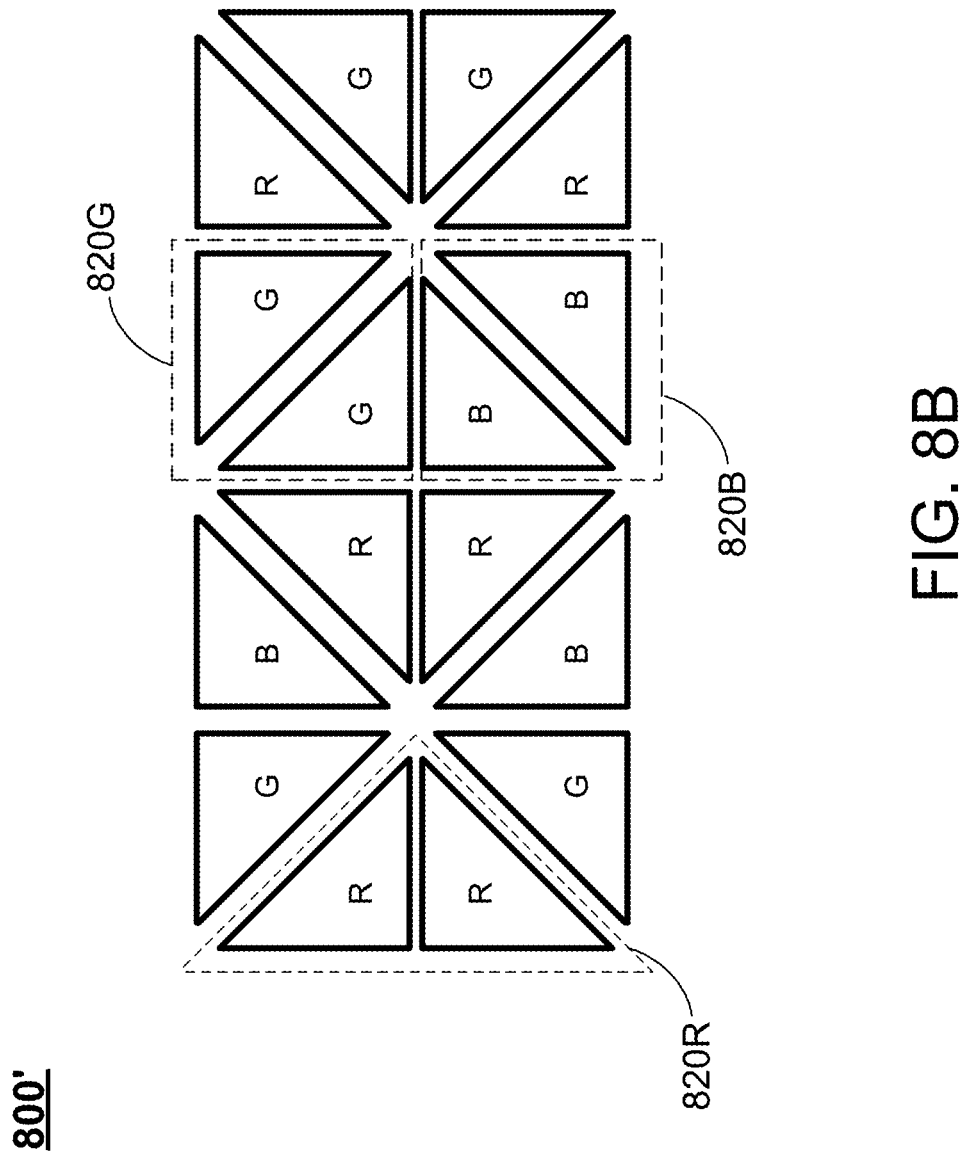
FIG. 8B schematically shows a pixel structure of a LED display panel according to certain embodiments of the present disclosure.

As shown in FIG. 8B, the pixel structure 800' is similar to the pixel structure 800 as shown in FIG. 8A, with a slightly different pixel arrangement. Specifically, in the pixel structure 800' as shown in FIG. 8B, only some of the pixels are formed by two bank openings in the shapes of right triangles mirroring each other along the column direction (i.e., the vertical direction as shown in FIG. 8B). Some other pixels, such as the G pixel 820G and the B pixel 820B, are formed by two bank openings in the shapes of right triangles mirroring each other along a respective slant direction, such that each of the G pixel 820G and the B pixel 820B is square shaped. In this case, the shape of each pixel in the pixel structure 800' is different from one another.

Figure 8C:
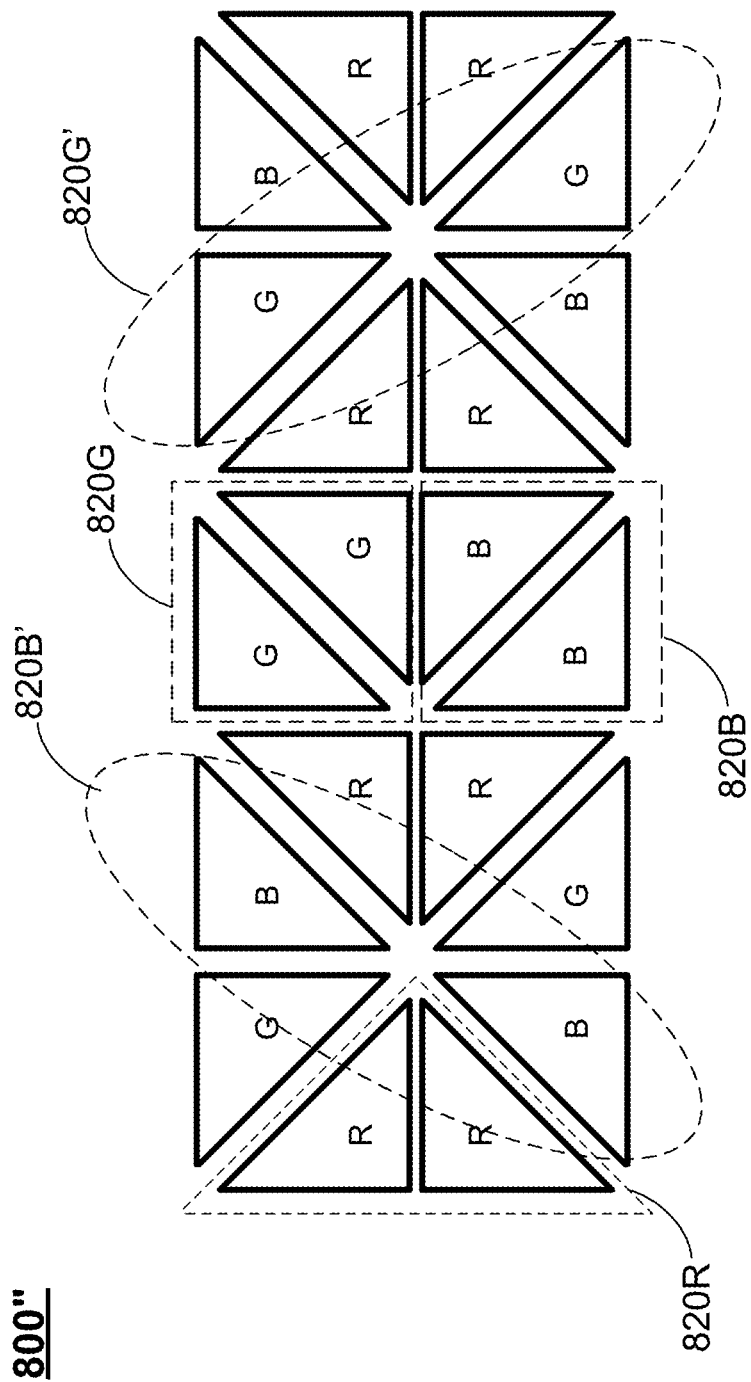
FIG. 8C schematically shows a pixel structure of a LED display panel according to certain embodiments of the present disclosure.

As shown in FIG. 8C, the pixel structure 800" is similar to the pixel structure 800' as shown in FIG. 8B, with a slightly different pixel arrangement. Specifically, in the pixel structure 800" as shown in FIG. 8C, only the R pixels 820R are formed by two bank openings in the shapes of right triangles mirroring each other along the column direction (i.e., the vertical direction as shown in FIG. 8C). Some of the G pixels 820G and the B pixels 820B are formed by two bank openings in the shapes of right triangles mirroring each other along a respective slant direction, which is similar to the G pixel 820G and the B pixel 820B as shown in FIG. 8B, such that each of the G pixel 820G and the B pixel 820B is square shaped. Further, some other G pixels 820G' and B pixels 820B' are formed by two bank openings in the shapes of right triangles mirroring each other along a respective diagonal direction, such that these G pixels 820G' and B pixels 820B' are formed in diagonally zigzag shapes. In this case, the shape of each pixel in the pixel structure 800" is different from one another. Further, the shapes of the G pixels are different from one another, and the shapes of the B pixels are different from one another.

Figure 8D:
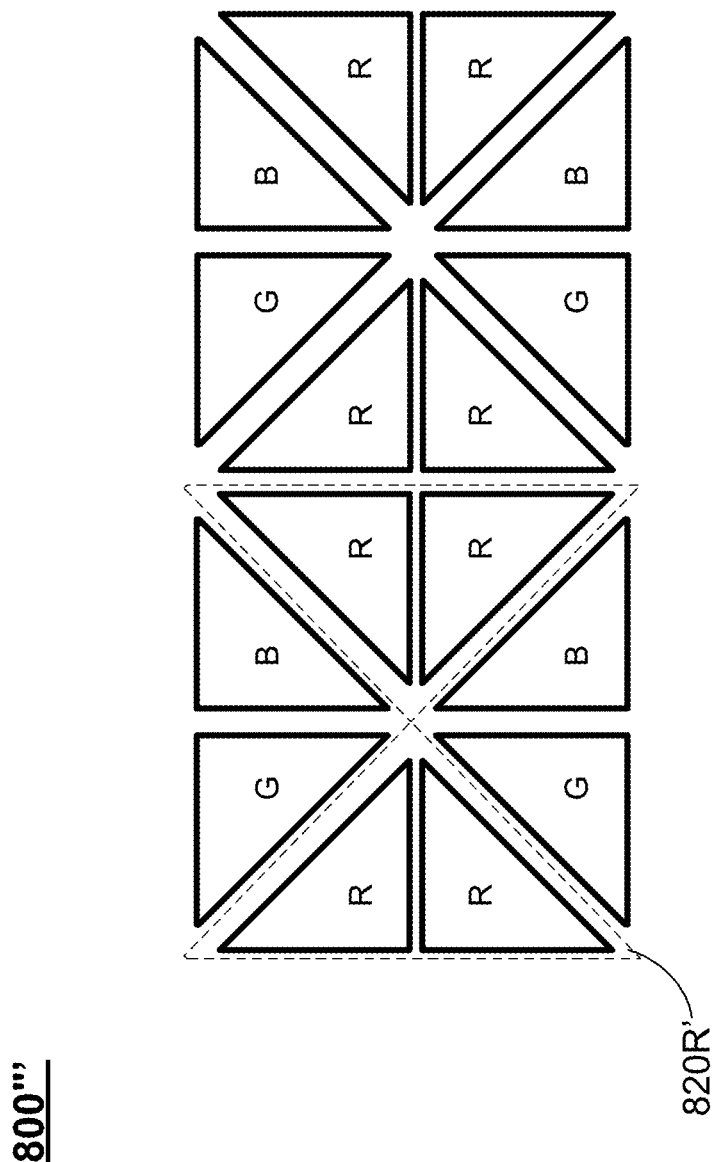
FIG. 8D schematically shows a pixel structure of a LED display panel according to certain embodiments of the present disclosure.

As shown in FIG. 8D, the pixel structure 800''' is similar to the pixel structure 800 as shown in FIG. 8A, with a further different pixel arrangement. Specifically, in the pixel structure 800''' as shown in FIG. 8D, instead of being formed by two bank openings, the R pixels 820R' are formed by four bank openings in the shapes of right triangles mirroring each other, such that in one set of the R, G and B pixels, the R pixel 820R' and the corresponding G pixel and B pixel collectively form a square. In this case, the shape of each pixel in the pixel structure 800''' is different from one another, and the size of the R pixels are greater than the size of the G pixels and the B pixels.

Figure 9:
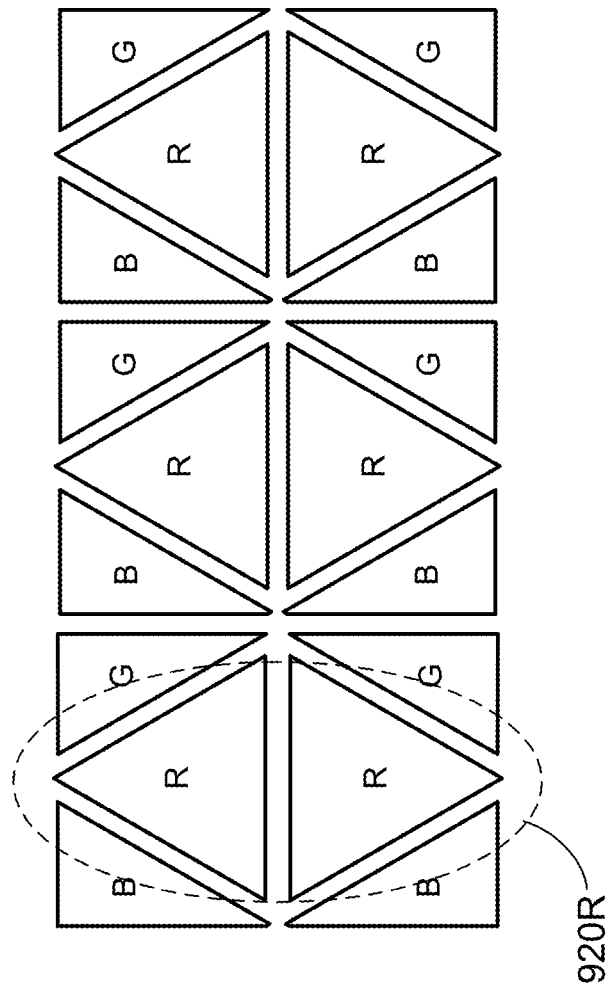
FIG. 9 schematically shows a pixel structure of a LED display panel according to certain embodiments of the present disclosure.

As shown in FIG. 9, in the pixel structure 900, each pixel is formed by two bank openings in the shapes of two triangles mirroring each other along the column direction (i.e., the vertical direction as shown in FIG. 9). However, the shapes of the triangles for each pixel are different. Specifically, for the R pixel 920R, the triangles are equilateral triangles, and for the B and G pixels adjacent to the R pixel 920R, the triangles are right triangles, such that the first bank openings of a set of the R, G and B pixels collectively form a rectangular shape. In this case, in one set of the R, G and B pixels, the size and shape of each pixel may be different from one another. However, the shapes of the first bank openings of all the R pixels are identical, the shapes of the first bank openings of all the G pixels are identical, and the shapes of the first bank openings of all the B pixels are identical.

Figure 10:
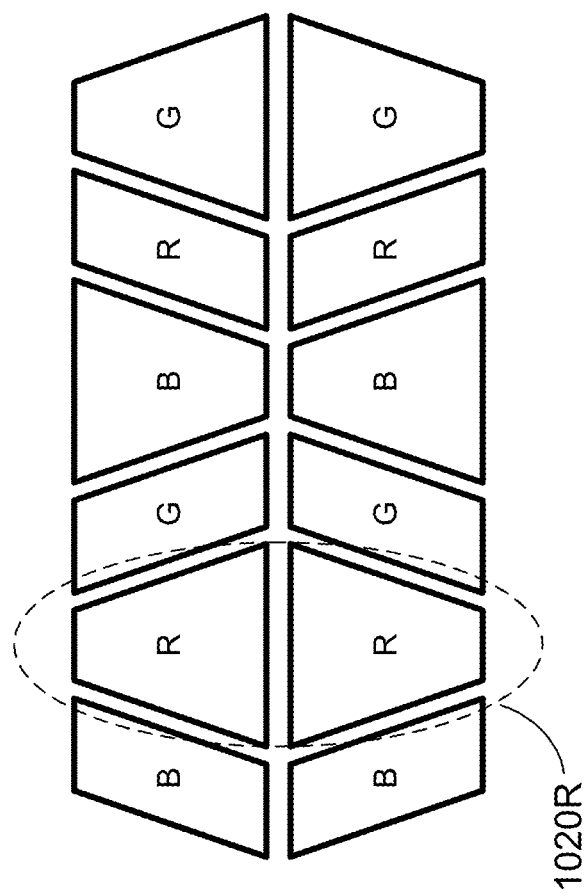
FIG. 10 schematically shows a pixel structure of a LED display panel according to certain embodiments of the present disclosure.

As shown in FIG. 10, in the pixel structure 1000, each pixel is formed by two bank openings in the shapes of two quadrilaterals mirroring each other along the column direction (i.e., the vertical direction as shown in FIG. 9). However, the shapes of the quadrilaterals for each pixel are different. Specifically, for the R pixel 1020R, the quadrilaterals are isosceles trapezoids, and for the B and G pixels adjacent to the R pixel 1020R, the quadrilaterals are parallelograms, such that the first bank openings of a set of the R, G and B pixels collectively form a trapezoid. In this case, in one set of the R, G and B pixels, the size and shape of each pixel may be different from one another. Further, the shape of the first bank opening of the R pixel 1020R (which is an isosceles trapezoid) is different from the shape of the first bank opening of the next R pixel (which is a parallelogram). In other words, the shapes of the first bank openings of at least two of the R pixels are different from each other. Similarly, the shapes of the first bank openings of at least two of the G pixels are different from each other, and the shapes of the first bank openings of at least two of the B pixels are different from each other.

Figure 11:
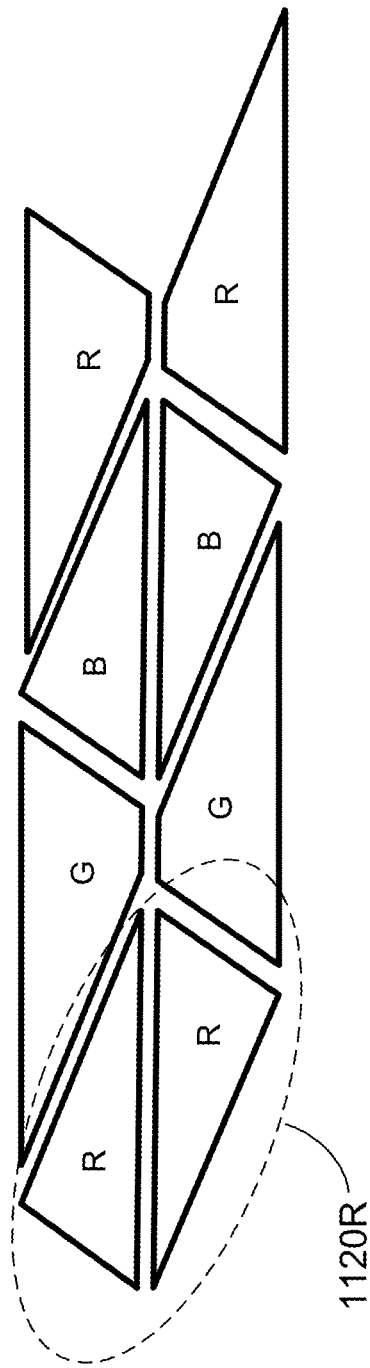
FIG. 11 schematically shows a pixel structure of a LED display panel according to certain embodiments of the present disclosure.

As shown in FIG. 11, in the pixel structure 1100, each pixel is formed by two bank openings in the shapes of two triangles or two quadrilaterals. Specifically, for each pixel in the pixel structure 1100, the two bank openings are not mirror shapes; instead, the two bank openings are 180° symmetrical to each other. Further, the shape of each pixel is different. Specifically, for the R pixel 1120R, the two bank openings are in triangular shapes 180° symmetrical to each other. For the G pixel, the two bank openings are in the shapes of trapezoids 180° symmetrical to each other. For the B pixel, the two bank openings are in triangular shapes 180° symmetrical to each other. In this case, the size and shape of each pixel in the pixel structure 900 is different from one another. Further, the shape of the first bank opening of the R pixel 1120R (which is a triangle) is different from the shape of the first bank opening of the next R pixel (which is a trapezoid). In other words, the shapes of the first bank openings of at least two of the R pixels are different from each other. Similarly, the shapes of the first bank openings of at least two of the G pixels are different from each other, and the shapes of the first bank openings of at least two of the B pixels are different from each other.

Figure 12A:
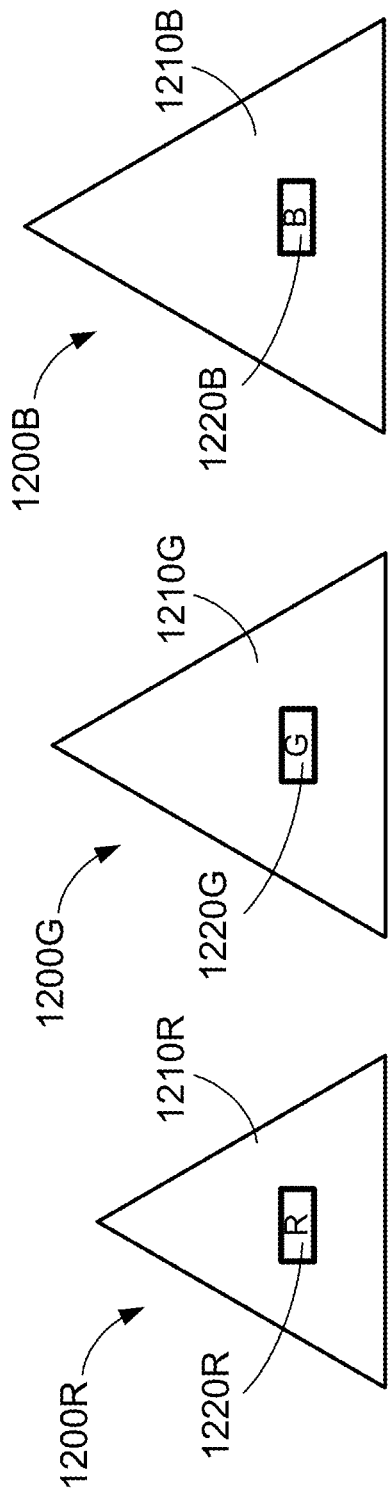
FIG. 12A schematically shows sizes of the R, G and B pixels in a pixel structure of a LED display panel according to one embodiment of the present disclosure.

In certain embodiments as disclosed above, the size and shape of the bank openings of the pixels may be different from each other. In certain embodiments, the size of the bank openings of the pixels may be determined by the LED emission efficiency of the pixels. Generally, the emission efficiency of the LEDs may vary based on the wavelength of the light emitted by the LEDs. For example, the LED emission efficiency of red LEDs is generally lower than the LED emission efficiency of green LEDs, and the LED emission efficiency of the green LEDs is lower than the LED emission efficiency of blue LEDs. To compensate the difference between the LED emission efficiencies of the LEDs, the size of the bank openings of the pixels may be adjusted. For example, FIG. 12A schematically shows sizes of the R, G and B pixels in a pixel structure of a LED display panel according to one embodiment of the present disclosure. As shown in FIG. 12A, each of the R, G and B pixels is represented by one first LED and a corresponding first bank opening of the pixel, which is illustrated in a triangular shape, and the size of the first LEDs 1220R, 1220G and 1220B are identical to one another. With the size of the first LEDs the size of the LEDs 1220R, 1220G and 1220B being identical, the size or area of the first bank opening 1210B of the B pixel 1200B is greater than the size or area of the first bank opening 1210G of the G pixel 1200G and the size of the first bank opening 1210R of the R pixel 1200R, and the size or area of the first bank opening 1210G of the G pixel 1200G is greater than the size or area of the first bank opening 1210R of the R pixel 1200R.

Figure 12B:
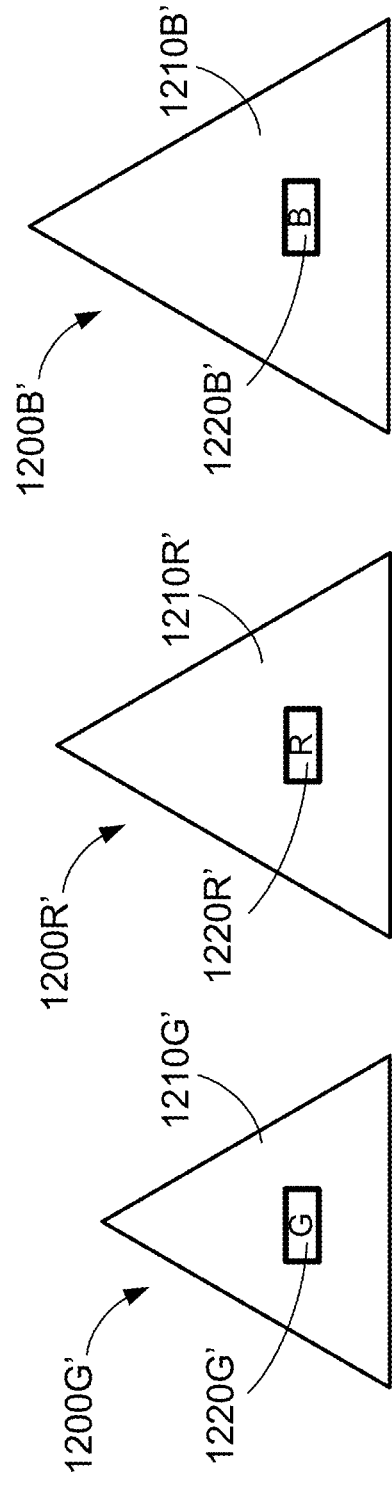
FIG. 12B schematically shows sizes of the R, G and B pixels in a pixel structure of a LED display panel according to another embodiment of the present disclosure.

Further, in certain embodiments, the size of the bank openings of the pixels may be determined by the LED illuminance of the pixels. Generally, the illuminance of the LEDs may vary based on the wavelength of the light emitted by the LEDs. For example, the illuminance of green LEDs is generally significantly better than the illuminance of red and blue LEDs, and the illuminance of red LEDs is slightly better than the illuminance of blue LEDs. To compensate the difference between the LED illuminances of the LEDs, the size of the reflective bank structures of the pixels may be adjusted. For example, FIG. 12B schematically shows sizes of the R, G and B pixels in a pixel structure of a LED display panel according to another embodiment of the present disclosure. As shown in FIG. 12B, each of the R, G and B pixels is represented by one first LED and a corresponding first bank opening of the pixel, which is illustrated in a triangular shape, and the size of the first LEDs 1220R', 1220G' and 1220B' are identical to one another. With the size of the first LEDs the size of the LEDs 1220R', 1220G' and 1220B' being identical, the size or area of the first bank opening 1210B' of the B pixel 1200B' is greater than the size or area of the first bank opening 1210G' of the G pixel 1200G' and the size or area of the first bank opening 1210R' of the R pixel 1200R', and the size or area of the first bank opening 1210R' of the R pixel 1200R' is greater than the size or area of the first bank opening 1210G' of the G pixel 1200G'.

It should be noted that, in each of FIGS. 12A and 12B, the reflective bank structures are not shown. Further, the triangular shape of the first bank openings of the pixels as shown in FIGS. 12A and 12B are merely provided for illustration purposes, and the shape of the first bank openings may change.

Further, it should be particularly noted that, for each of the first bank openings 1210R, 1210G and 1210B as shown in FIG. 12A and each of the first bank openings 1210R', 1210G' and 1210B' as shown in FIG. 12B, the "size" or the "area" of the first bank opening refers to the "size" or the "area" of the bottom of the first bank opening, where the back plate is exposed.

Further, as shown in the embodiment as shown in FIG. 8D, the quantities of the bank openings of the pixels may be varied. Specifically, as shown in FIG. 8D, the quantity of the bank openings of the R pixels (4 in one set of the RGB pixels) are greater than the quantity of the bank openings of the G pixels (2 in the same set of the RGB pixels) and the quantity of the bank openings of the B pixels (2 in the same set of the RGB pixels). Thus, the quantities of the bank openings of the pixels may be adjusted in order to compensate the difference between the LED emission efficiencies or the LED illuminances of the LEDs. In certain embodiments, to compensate the difference between the LED emission efficiencies of the LEDs, the quantity of the bank openings of the R pixels may be greater than the quantity of the bank openings of the G pixels and the quantity of the bank openings of the B pixels, and the quantity of the bank openings of the G pixels may be greater than the quantity of the bank openings of the B pixels. In certain embodiments, to compensate the difference between the LED illuminances of the LEDs, the quantity of the bank openings of the G pixels may be greater than the quantity of the bank openings of the R pixels and the quantity of the bank openings of the B pixels, and the quantity of the bank openings of the R pixels may be greater than the quantity of the bank openings of the B pixels.

Figure 13A:
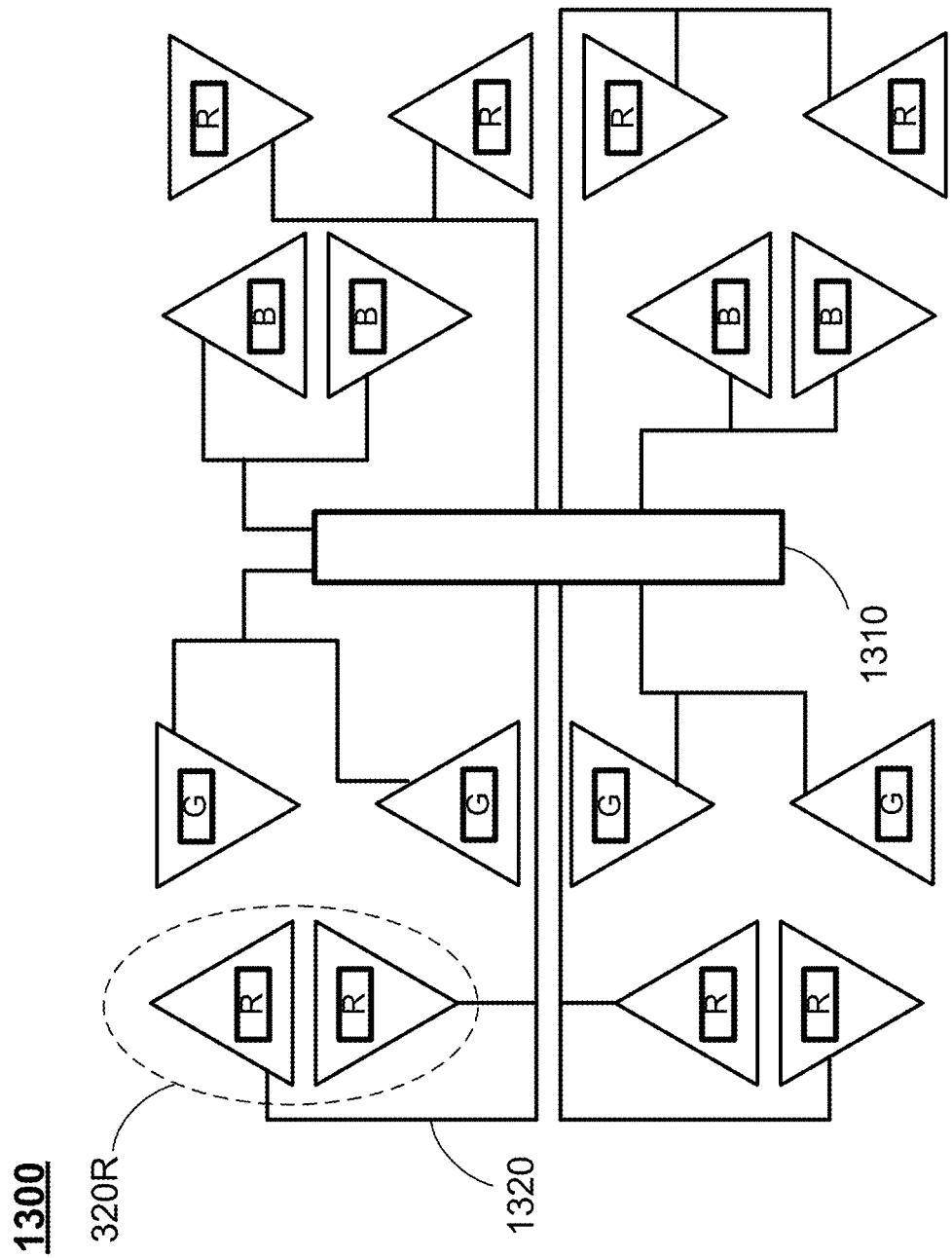
FIG. 13A schematically shows connections between a driver IC and pixels in the pixel structure as shown in FIG. 3A according to certain embodiments of the present disclosure.

It should be noted that, in each of the embodiments as disclosed above, the LED display panel may include other structures. For example, the LED display panel may include one or more drivers to driver the corresponding ones of the pixels in the pixel structures. In certain embodiments, the drivers of the LED display panel may be in the form of integrated circuits (ICs) or semiconductor devices. For example, FIG. 13A schematically shows connections between a driver IC and pixels in the pixel structure as shown in FIG. 3A according to certain embodiments of the present disclosure, and FIG. 13B schematically shows connections between a driver IC and pixels in the pixel structure as shown in FIG. 6 according to certain embodiments of the present disclosure. As shown in FIG. 13A, the LED display panel 1300 includes a driver IC 1310, which is connected to the pixels using a plurality of signal lines 1320. Specifically, for each of the pixels, the driver IC 1310 is connected to the two sub-pixel portions of the same pixel using the same signal line 1320. For example, for the R pixel 320R, the driver IC 1310 is connected to the two sub-pixel portions of the same R pixel 320R using the same signal line 1320. Similarly, as shown in FIG. 13B, the LED display panel 1300' includes a driver IC 1310, which is connected to the pixels using a plurality of signal lines 1320. Since the pixel arrangement of the LED display panel 1300' as shown in FIG. 13B is different from that of the LED display panel 1300 as shown in FIG. 13A, the arrangements of the signal lines 1320 are also different.

Figure 14A:
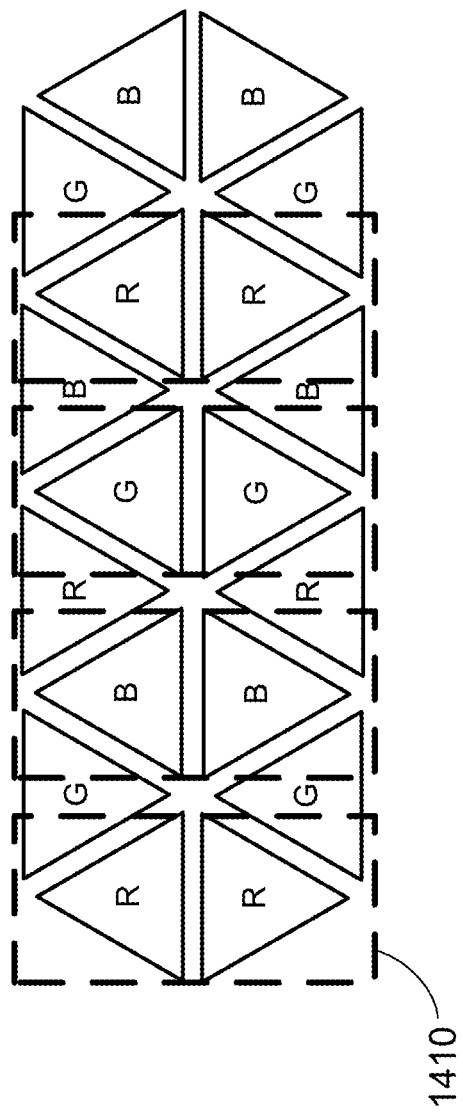
FIG. 14A schematically shows arrangements of an active matrix layer and pixels in the pixel structure as shown in FIG. 3A according to certain embodiments of the present disclosure.
Figure 14B:
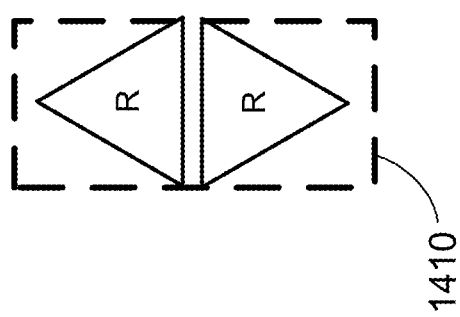
FIG. 14B schematically shows an active driving unit and a corresponding pixel as shown in FIG. 14A according to one embodiment of the present disclosure.
Figure 14C:
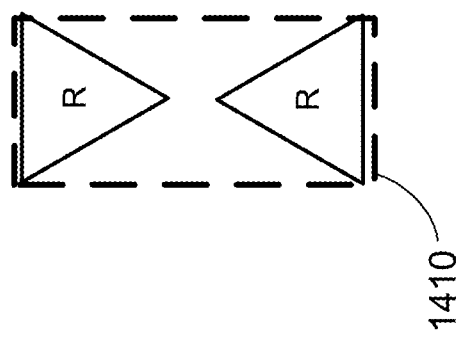
FIG. 14C schematically shows an active driving unit and a corresponding pixel as shown in FIG. 14A according to another embodiment of the present disclosure.

In certain embodiments, the drivers of the LED display panel may be in the form of drivers in an active matrix. For example, FIG. 14A schematically shows arrangements of an active matrix layer and pixels in the pixel structure as shown in FIG. 3A according to certain embodiments of the present disclosure, and FIGS. 14B and 14C shows two examples of the active driving units and the corresponding pixels. As shown in FIG. 14A, the LED display panel 1300 includes an active matrix, which includes a plurality of driving units 1410. Each driving unit 1410 is formed on the active matrix in an active driving layer to drive a corresponding pixel. Since each pixel includes two sub-pixel portions mirror to each other along the column direction, each driving unit 1410 may be in the shape of a rectangle, as shown in FIGS. 14B and 14C, such that the driving units 1410 may one-to-one correspond to the pixels. In other words, each of the driving units 1410 has a shape different from a combination of the triangular shapes of the first bank opening and the second bank opening of the corresponding pixels.

Figure 15B:
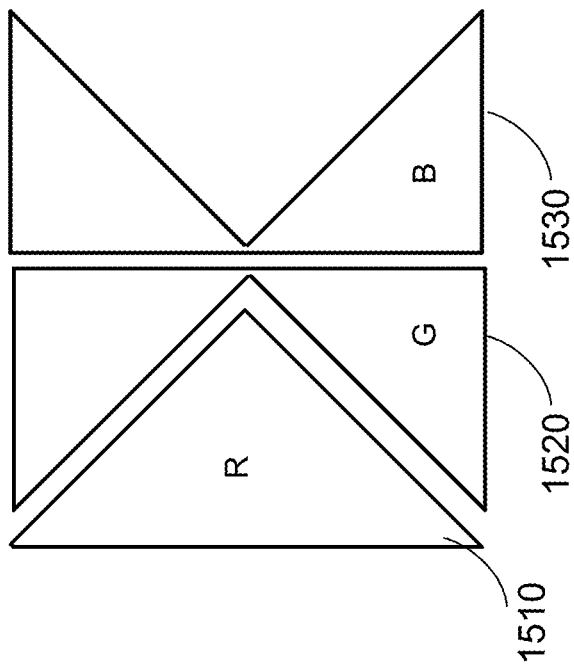
FIG. 15B schematically shows the driving units as shown in FIG. 15A according to certain embodiments of the present disclosure.
Figure 15A:
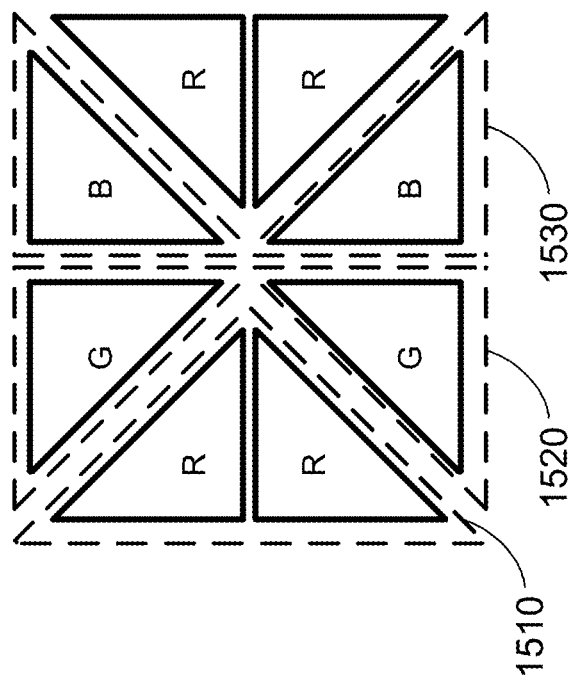
FIG. 15A schematically shows arrangements of an active matrix layer and pixels in the pixel structure as shown in FIG. 8A according to certain embodiments of the present disclosure.

FIG. 15A schematically shows arrangements of an active matrix layer and pixels in the pixel structure as shown in FIG. 8A according to certain embodiments of the present disclosure, and FIG. 15B schematically shows the driving units as shown in FIG. 15A according to certain embodiments of the present disclosure. As shown in FIGS. 15A and 15B, the driving units 1510, 1520 and 1530 corresponds to the shapes of the corresponding pixels. Specifically, the driving unit 1510 is in a triangular shape, and the driving units 1520 and 1530 are respectively in a combined shape of two triangles.

Figure 15C:
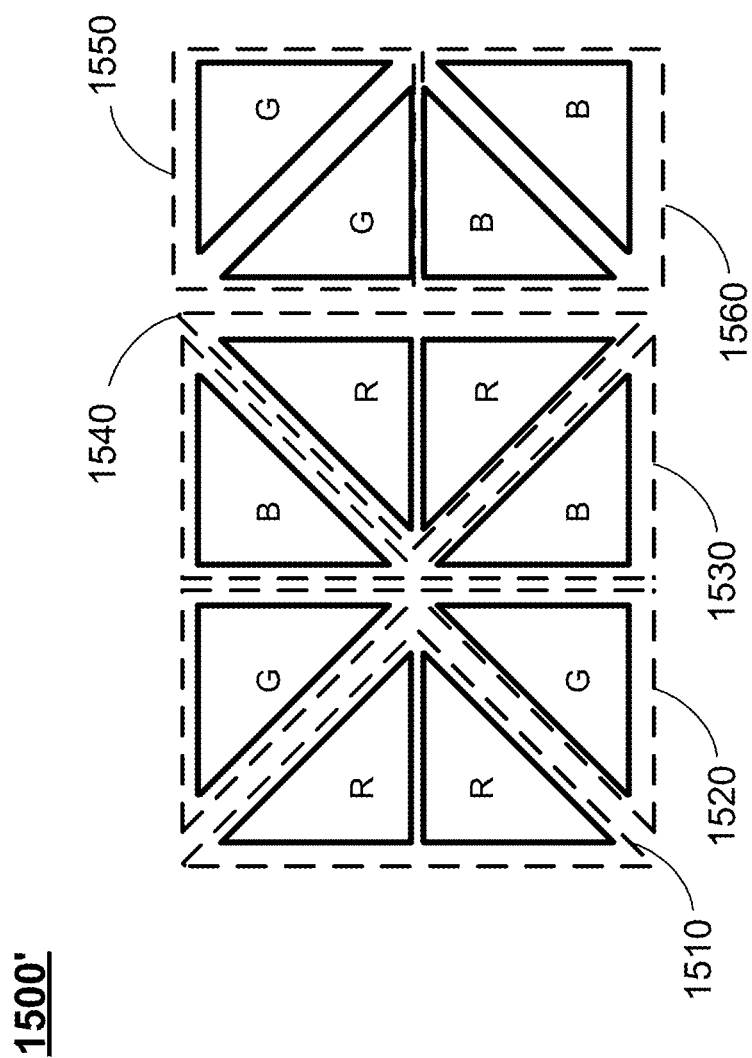
FIG. 15C schematically shows arrangements of an active matrix layer and pixels in the pixel structure as shown in FIG. 8B according to certain embodiments of the present disclosure.
Figure 15D:
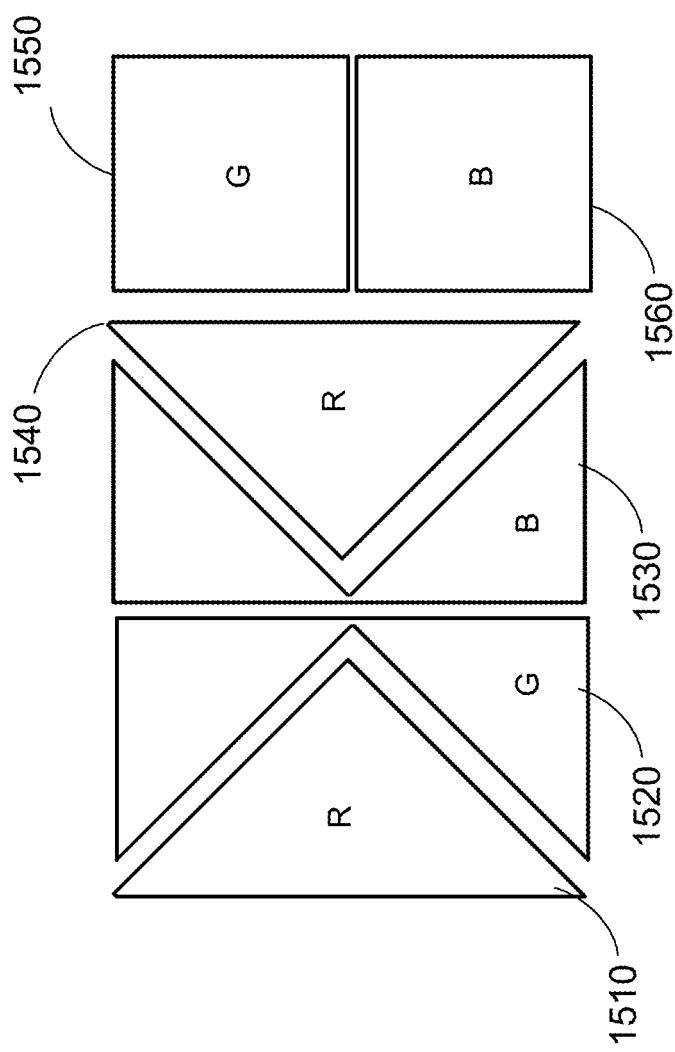
FIG. 15D schematically shows the driving units as shown in FIG. 15C according to certain embodiments of the present disclosure.

FIG. 15C schematically shows arrangements of an active matrix layer and pixels in the pixel structure as shown in FIG. 8B according to certain embodiments of the present disclosure, and FIG. 15D schematically shows the driving units as shown in FIG. 15C according to certain embodiments of the present disclosure. As shown in FIGS. 15C and 15D, the driving units 1510, 1520, 1530, 1540, 1550 and 1560 corresponds to the shapes of the corresponding pixels. Specifically, the driving units 1510 and 1540 are in triangular shapes, the driving units 1520 and 1530 are respectively in a combined shape of two triangles, and the driving units 1550 and 1560 are respectively in square shapes.

In certain embodiments, the size and shape of the LEDs used in the LED display panel may vary. Generally, a LED may be categorized as a horizontal LED, a vertical LED or flip chip LED based on the P-N structure of the LED.

Figure 16A:
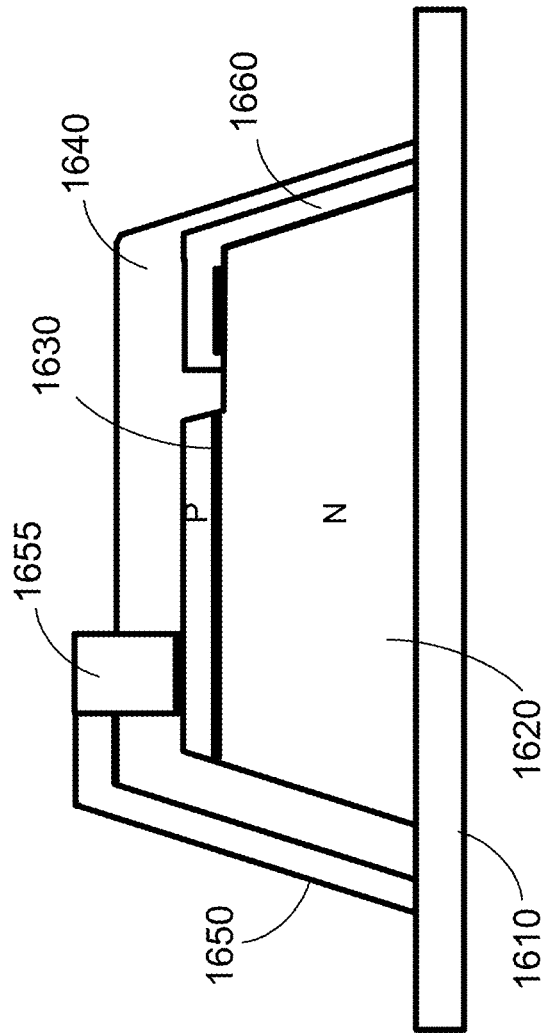
FIG. 16A schematically shows a horizontal LED according to certain embodiments of the present disclosure.

FIG. 16A schematically shows a horizontal LED according to certain embodiments of the present disclosure. As shown in FIG. 16A, in the horizontal LED structure 1600, the LED 1620 is formed on the back plate 1610, where a P-N junction 1630 is provided as an active layer. A P conductive line 1650 is connected to the P electrode (i.e., the anode) of the LED 1620, and an N conductive line 1660 is connected to the N electrode (i.e., the cathode) of the LED 1620. An insulating layer 1640 covers the LED 1620 and the N conductive line 1660, and the P conductive line 1650 is connected to the P electrode of the LED 1620 through a via 1655 formed in the insulating layer 1640.

Figure 16B:
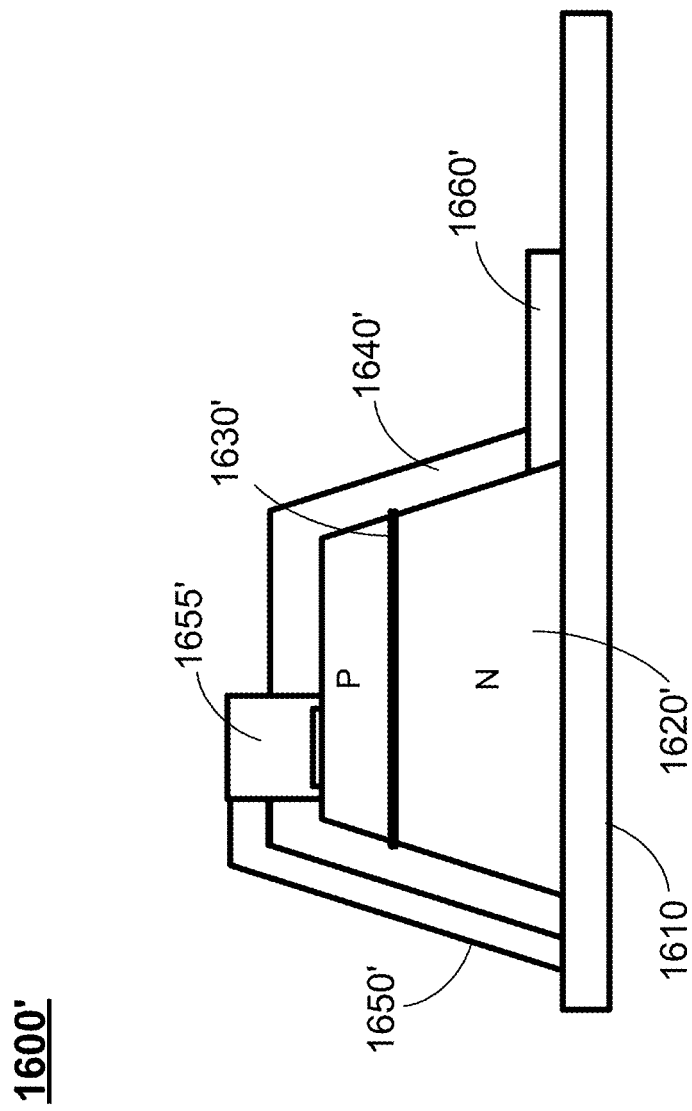
FIG. 16B schematically shows a vertical LED according to certain embodiments of the present disclosure.

FIG. 16B schematically shows a vertical LED according to certain embodiments of the present disclosure. Specifically, the vertical LED structure 1600' as shown in FIG. 16B has similar components to those in the horizontal LED structure 1600 as shown in FIG. 16A, but the shapes and locations of the components are arranged differently. As shown in FIG. 16B, in the vertical LED structure 1600', the LED 1620' is formed on the back plate 1610, where a P-N junction 1630' is provided as an active layer. A P conductive line 1650' is connected to the P electrode (i.e., the anode) of the LED 1620', and an N conductive line 1660' is connected to the N electrode (i.e., the cathode) of the LED 1620'. An insulating layer 1640' covers the LED 1620' and the N conductive line 1660', and the P conductive line 1650' is connected to the P electrode of the LED 1620' through a via 1655' formed in the insulating layer 1640'.

Figure 16C:
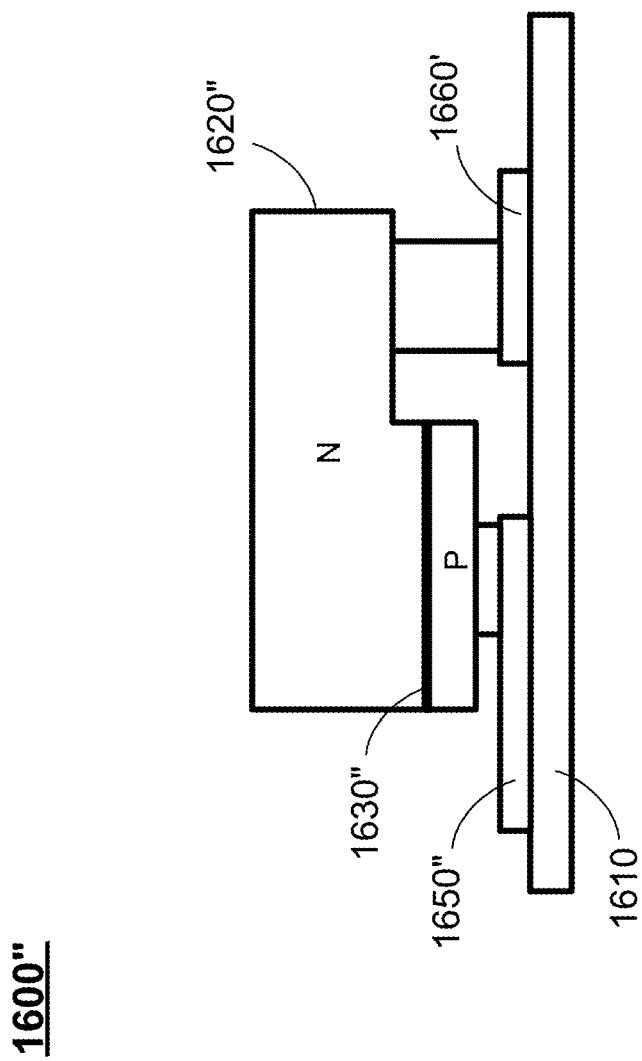
FIG. 16C schematically shows a flip chip LED according to certain embodiments of the present disclosure.

FIG. 16C schematically shows a flip chip LED according to certain embodiments of the present disclosure. Specifically, the flip chip LED structure 1600" as shown in FIG.

16C has similar components to those in the horizontal LED structure 1600 as shown in FIG. 16A, but the shapes and locations of the components are arranged differently. As shown in FIG. 16C, in the flip chip LED structure 1600", the LED 1620" is formed on the back plate 1610, where a P-N junction 1630" is provided as an active layer. A P conductive line 1650" is connected to the P electrode (i.e., the anode) of the LED 1620", and an N conductive line 1660" is connected to the N electrode (i.e., the cathode) of the LED 1620'. It should be noted that, comparing to the LED 1620 as shown in FIG. 16A and the LED 1620' as shown in FIG. 16B, the LED 1620" as shown in FIG. 16C is disposed upside-down, such that the P electrode is located closer to the back plate, thus forming the "flip chip" structure. In this case, no insulating layer is required to cover the LED 1620" because the P conductive line 1650" and the N conductive line 1660" extend toward different sides of the LED 1620".

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting diode (LED) display panel, comprising:
    a back plate;
    a pixel structure comprising a plurality of pixels, wherein each of the pixels comprises:
        a reflector structure disposed on the back plate, the reflector structure having a first reflective bank structure and a second reflective bank structure, the first reflective bank structure having a first bank opening, and the second reflective bank structure having a second bank opening, wherein the first bank opening has a first shape, the second bank opening has a second shape, and the second shape is a mirror shape of the first shape or a 180° symmetrical shape of the first shape; and
        a first LED and a second LED disposed on the back plate and emitting light of a same color, wherein the first LED is disposed within the first bank opening of the first reflective bank structure, and the second LED is disposed within the second bank opening of the second reflective bank structure; and
    an active driving layer having a plurality of driving units, wherein each of the driving units is configured to drive a corresponding one of the pixels, and each of the driving units has a shape different from a combination of the first shape of the first bank opening and the second shape of the second bank opening of the corresponding one of the pixels;
    wherein for each of the pixels, the first shape of the first bank opening is a triangle, and at least two corners of the first shape have an included angle less than 90°.

2. The LED display panel of claim 1, wherein for each of the pixels, the first bank opening and the second bank opening are disposed to mirror each other along a same direction.

3. The LED display panel of claim 1, wherein for each of the pixels in a first row, the first bank opening and the second bank opening are disposed to mirror each other along a first direction, and for each of the pixels in a second row adjacent to the first row, the first bank opening and the second bank opening are disposed to mirror each other along a second direction different from the first direction.

4. The LED display panel of claim 1, wherein for each of the pixels, the first LED is disposed within an LED area in the first bank opening, the LED area has a similar triangular shape to the triangle forming the first shape, and vertices of the similar triangular shape of the LED area are located at midpoints of median lines connecting vertices of the first shape to a centroid of the first shape.

5. The LED display panel of claim 4, wherein for each of the pixels, the first LED is located at the centroid of the first shape, and the second LED is correspondingly located at a centroid of the second shape.

6. The LED display panel of claim 1, wherein the first shapes of the first bank openings of all of the pixels are identical.

7. The LED display panel of claim 1, wherein for each of the pixels, the first reflective bank structure has two first sidewalls located at two sides of the first bank opening, and along a sectional plane perpendicular to the back plate and crossing the first LED, each of the first sidewalls extends slantly outward from the back plate to define an acute angle α between the back plate and each of the first sidewalls, wherein the acute angle α is in a range between 20° and 80°.

8. The LED display panel of claim 1, wherein the pixels comprise a plurality of red (R) pixels, a plurality of green (G) pixels, and a plurality of blue (B) pixels.

9. The LED display panel of claim 8, wherein an area of the first bank opening of each of the B pixels is greater than an area of the first bank opening of each of the R pixels, and an area of the first bank opening of each of the B pixels is greater than the area of the first bank opening of each of the G pixels.

10. The LED display panel of claim 9, wherein the area of the first bank opening of each of the R pixels is greater than the area of the first bank opening of each of the G pixels.

11. The LED display panel of claim 9, wherein the area of the first bank opening of each of the G pixels is greater than the area of the first bank opening of each of the R pixels.

12. The LED display panel of claim 8, wherein the first shapes of the first bank opening of the R pixels are identical, the first shapes of the first bank opening of the G pixels are identical, and the first shapes of the first bank opening of the B pixels are identical.

13. The LED display panel of claim 8, wherein the first shapes of the first bank openings of at least two of the R pixels are different from each other, the first shapes of the first bank openings of at least two of the G pixels are different from each other, and the first shapes of the first bank openings of at least two of the B pixels are different from each other.

14. The LED display panel of claim 1, wherein for each of the pixels, the first reflective bank structure and the second reflective bank structure are connected to each other.

15. The LED display panel of claim 1, wherein for each of the pixels, the first reflective bank structure and the second reflective bank structure are separated from each other.

16. The LED display panel of claim 1, wherein the shape of each of the driving units is a rectangle, a square, a triangle, or a combination thereof.

17. The LED display panel of claim 1, wherein an LED is structured as a horizontal LED, a vertical LED, or a flip chip LED.

* * * * *